United States Patent
Platzgummer et al.

(10) Patent No.: US 9,443,699 B2
(45) Date of Patent: Sep. 13, 2016

(54) MULTI-BEAM TOOL FOR CUTTING PATTERNS

(71) Applicant: IMS Nanofabrication AG, Vienna (AT)

(72) Inventors: Elmar Platzgummer, Vienna (AT); Hans Löschner, Vienna (AT)

(73) Assignee: IMS Nanofabrication AG, Vienna (AT)

( * ) Notice: Subject to any disclaimer, the term of this patent is extended or adjusted under 35 U.S.C. 154(b) by 0 days.

(21) Appl. No.: 14/694,959

(22) Filed: Apr. 23, 2015

(65) Prior Publication Data

US 2015/0311030 A1    Oct. 29, 2015

(30) Foreign Application Priority Data

Apr. 25, 2014 (EP) .................................... 14165970

(51) Int. Cl.
| | |
|---|---|
| H01J 37/317 | (2006.01) |
| H01J 37/09 | (2006.01) |
| H01J 37/04 | (2006.01) |
| H01J 37/147 | (2006.01) |

(52) U.S. Cl.
CPC .......... *H01J 37/3177* (2013.01); *H01J 37/045* (2013.01); *H01J 37/09* (2013.01); *H01J 37/147* (2013.01); *H01J 37/3174* (2013.01); H01J 2237/0435 (2013.01)

(58) Field of Classification Search
CPC ...... H01J 37/147; H01J 37/045; H01J 37/09; H01J 37/252; H01J 37/31; H01J 37/3174; H01J 37/3177; H01J 2237/0435
See application file for complete search history.

(56) References Cited

U.S. PATENT DOCUMENTS

| | | | |
|---|---|---|---|
| 1,033,741 A | 7/1912 | Sims | |
| 1,420,104 A | 6/1922 | Howe et al. | |
| 1,903,005 A | 3/1933 | McCuen | |
| 2,187,427 A | 1/1940 | Middleton | |

(Continued)

FOREIGN PATENT DOCUMENTS

| | | |
|---|---|---|
| CN | 202204836 U | 4/2012 |
| EP | 1033741 A2 | 9/2000 |

(Continued)

OTHER PUBLICATIONS

European Search Report for Application No. 09450211.9-1226, report dated Sep. 14, 2010, 4 pgs.

(Continued)

*Primary Examiner* — Jack Berman
(74) *Attorney, Agent, or Firm* — KPPB LLP

(57) ABSTRACT

In a charged-particle multi-beam processing apparatus for exposure of a target with a plurality of parallel particle-optical columns, each column has a beam shaping device forming the shape of the illuminating beam into a desired pattern composed of a multitude of sub-beams, by means of an aperture array device, which defines the shape of a respective sub-beam by means of an array of apertures, and a deflection array device selectively deflecting sub-beams off their nominal paths; thus, only the non-selected sub-beams can reach the target. According to many embodiments of the invention each beam shaping device is provided with a first field-boundary device and a second field-boundary device, which are the first and last plate elements traversed by the beam. One of the first and second field-boundary devices defines a field-free space interval so as to accommodate feeding lines for controlling the deflection array device.

19 Claims, 16 Drawing Sheets

(56) References Cited

U.S. PATENT DOCUMENTS

| | | |
|---|---|---|
| 2,820,109 A | 1/1958 | Dewitz |
| 2,920,104 A | 1/1960 | Brooks et al. |
| 3,949,265 A | 4/1976 | Holl |
| 4,467,211 A | 8/1984 | Smith et al. |
| 4,735,881 A | 4/1988 | Kobayashi et al. |
| 4,899,060 A | 2/1990 | Lischke |
| 5,103,101 A | 4/1992 | Berglund et al. |
| 5,260,579 A | 11/1993 | Yasuda et al. |
| 5,369,282 A | 11/1994 | Arai et al. |
| 5,399,872 A | 3/1995 | Yasuda et al. |
| 5,814,423 A | 9/1998 | Maruyama et al. |
| 5,841,145 A | 11/1998 | Satoh et al. |
| 5,847,959 A | 12/1998 | Veneklasen et al. |
| 5,857,815 A | 1/1999 | Bailey et al. |
| 5,876,902 A | 3/1999 | Veneklasen |
| 5,933,211 A | 8/1999 | Nakasugi et al. |
| 6,014,200 A | 1/2000 | Sogard et al. |
| 6,043,496 A | 3/2000 | Tennant |
| 6,049,085 A | 4/2000 | Ema |
| 6,111,932 A | 8/2000 | Dinsmore |
| 6,137,113 A | 10/2000 | Muraki |
| 6,225,637 B1 | 5/2001 | Terashima et al. |
| 6,229,595 B1 | 5/2001 | McKinley et al. |
| 6,252,339 B1 | 6/2001 | Kendall |
| 6,280,798 B1 | 8/2001 | Ring et al. |
| 6,333,138 B1 | 12/2001 | Higashikawa et al. |
| 6,472,673 B1 | 10/2002 | Chalupka et al. |
| 6,473,237 B2 | 10/2002 | Mei |
| 6,552,353 B1 | 4/2003 | Muraki et al. |
| 6,617,587 B2 | 9/2003 | Parker |
| 6,767,125 B2 | 7/2004 | Midas et al. |
| 6,768,125 B2 | 7/2004 | Platzgummer et al. |
| 6,786,125 B2 | 9/2004 | Imai |
| 6,835,937 B1 | 12/2004 | Muraki et al. |
| 6,858,118 B2 | 2/2005 | Platzgummer et al. |
| 6,897,454 B2 | 5/2005 | Sasaki et al. |
| 6,965,153 B1 | 11/2005 | Ono et al. |
| 7,084,411 B2 | 8/2006 | Lammer-Pachlinger et al. |
| 7,124,660 B2 | 10/2006 | Chiang |
| 7,129,024 B2 | 10/2006 | Ki |
| 7,199,373 B2 | 4/2007 | Stengl et al. |
| 7,201,213 B2 | 4/2007 | Leeson et al. |
| 7,214,951 B2 | 5/2007 | Stengl et al. |
| 7,276,714 B2 | 10/2007 | Platzgummer et al. |
| 7,459,247 B2 | 12/2008 | Bijnen et al. |
| 7,687,783 B2 | 3/2010 | Platzgummer et al. |
| 7,710,634 B2 | 5/2010 | Sandstrom |
| 7,714,298 B2 | 5/2010 | Platzgummer et al. |
| 7,741,620 B2 | 6/2010 | Doering et al. |
| 7,772,574 B2 | 8/2010 | Stengl et al. |
| 7,777,201 B2 | 8/2010 | Fragner et al. |
| 7,781,748 B2 | 8/2010 | Platzgummer et al. |
| 7,823,081 B2 | 10/2010 | Sato et al. |
| 8,057,972 B2 | 11/2011 | Fragner et al. |
| 8,183,543 B2 | 5/2012 | Platzgummer et al. |
| 8,198,601 B2 | 6/2012 | Platzgummer et al. |
| 8,222,621 B2 | 7/2012 | Fragner et al. |
| 8,227,768 B2 | 7/2012 | Smick et al. |
| 8,257,888 B2 | 9/2012 | Sczyrba et al. |
| 8,258,488 B2 | 9/2012 | Platzgummer et al. |
| 8,294,117 B2 | 10/2012 | Kruit et al. |
| 8,304,749 B2 | 11/2012 | Platzgummer et al. |
| 8,378,320 B2 | 2/2013 | Platzgummer |
| 8,502,174 B2 | 8/2013 | Wieland |
| 8,546,767 B2 | 10/2013 | Platzgummer et al. |
| 8,563,942 B2 | 10/2013 | Platzgummer |
| 8,598,544 B2 | 12/2013 | Van De Peut et al. |
| 9,053,906 B2 | 6/2015 | Platzgummer |
| 9,093,201 B2 | 7/2015 | Platzgummer et al. |
| 9,099,277 B2 | 8/2015 | Platzgummer |
| 9,269,543 B2 | 2/2016 | Reiter et al. |
| 9,373,482 B2 | 6/2016 | Platzgummer |
| 2001/0028038 A1* | 10/2001 | Hamaguchi ......... H01J 37/3177 250/396 ML |
| 2002/0021426 A1 | 2/2002 | Mei et al. |
| 2002/0148978 A1 | 10/2002 | Innes et al. |
| 2003/0085360 A1 | 5/2003 | Parker et al. |
| 2003/0106230 A1 | 6/2003 | Hennessey |
| 2003/0155534 A1 | 8/2003 | Platzgummer et al. |
| 2003/0160980 A1 | 8/2003 | Olsen et al. |
| 2004/0058536 A1 | 3/2004 | Ki |
| 2004/0119021 A1 | 6/2004 | Parker et al. |
| 2004/0157407 A1 | 8/2004 | Tong et al. |
| 2004/0169147 A1 | 9/2004 | Ono et al. |
| 2005/0063510 A1 | 3/2005 | Hieronimi et al. |
| 2005/0072941 A1 | 4/2005 | Tanimoto et al. |
| 2005/0104013 A1 | 5/2005 | Stengl et al. |
| 2005/0242302 A1 | 11/2005 | Platzgummer et al. |
| 2005/0242303 A1 | 11/2005 | Platzgummer |
| 2006/0060775 A1 | 3/2006 | Sakakibara et al. |
| 2006/0076509 A1 | 4/2006 | Okino et al. |
| 2006/0169925 A1 | 8/2006 | Miyajima et al. |
| 2007/0138374 A1 | 6/2007 | Nishibashi et al. |
| 2007/0178407 A1 | 8/2007 | Hatakeyama et al. |
| 2007/0279768 A1 | 12/2007 | Shibazaki et al. |
| 2008/0024745 A1 | 1/2008 | Baselmans et al. |
| 2008/0080782 A1 | 4/2008 | Olsson et al. |
| 2008/0099693 A1 | 5/2008 | Platzgummer |
| 2008/0105827 A1 | 5/2008 | Tamamushi |
| 2008/0128638 A1 | 6/2008 | Doering et al. |
| 2008/0142728 A1 | 6/2008 | Smick et al. |
| 2008/0198352 A1 | 8/2008 | Kugler et al. |
| 2008/0203317 A1 | 8/2008 | Platzgummer et al. |
| 2008/0237460 A1 | 10/2008 | Fragner et al. |
| 2008/0257096 A1 | 10/2008 | Zhu et al. |
| 2008/0283767 A1 | 11/2008 | Platzgummer |
| 2008/0299490 A1 | 12/2008 | Takekoshi |
| 2009/0032700 A1 | 2/2009 | Park et al. |
| 2009/0101816 A1 | 4/2009 | Noji et al. |
| 2009/0256075 A1 | 10/2009 | Kemen et al. |
| 2009/0321631 A1 | 12/2009 | Smick et al. |
| 2010/0127185 A1 | 5/2010 | Fragner et al. |
| 2010/0178602 A1 | 7/2010 | Seto et al. |
| 2010/0187434 A1 | 7/2010 | Platzgummer |
| 2010/0288938 A1 | 11/2010 | Platzgummer |
| 2011/0053087 A1 | 3/2011 | Nielsen et al. |
| 2011/0073782 A1 | 3/2011 | Wieland |
| 2011/0204253 A1 | 8/2011 | Platzgummer et al. |
| 2011/0226968 A1 | 9/2011 | Platzgummer |
| 2012/0076269 A1 | 3/2012 | Roberts et al. |
| 2012/0085940 A1 | 4/2012 | Matsumoto |
| 2012/0211674 A1 | 8/2012 | Kato |
| 2012/0286169 A1 | 11/2012 | Van De Peut et al. |
| 2012/0286170 A1 | 11/2012 | Van de Peut et al. |
| 2012/0288787 A1 | 11/2012 | Choi et al. |
| 2013/0157198 A1 | 6/2013 | Yoshikawa et al. |
| 2013/0164684 A1 | 6/2013 | Yamanaka |
| 2013/0252145 A1 | 9/2013 | Matsumoto et al. |
| 2013/0253688 A1 | 9/2013 | Matsumoto |
| 2014/0042334 A1 | 2/2014 | Wieland |
| 2014/0197327 A1 | 7/2014 | Platzgummer |
| 2014/0240732 A1 | 8/2014 | Tinnemans et al. |
| 2014/0322927 A1 | 10/2014 | Morita |
| 2014/0346369 A1 | 11/2014 | Matsumoto |
| 2015/0021493 A1 | 1/2015 | Platzgummer |
| 2015/0028230 A1 | 1/2015 | Platzgummer |
| 2015/0069260 A1 | 3/2015 | Platzgummer |
| 2015/0243480 A1 | 8/2015 | Yamada et al. |
| 2015/0248993 A1 | 9/2015 | Reiter et al. |
| 2015/0311031 A1 | 10/2015 | Platzgummer et al. |
| 2016/0012170 A1 | 1/2016 | Platzgummer |
| 2016/0013019 A1 | 1/2016 | Platzgummer |
| 2016/0071684 A1 | 3/2016 | Platzgummer et al. |

FOREIGN PATENT DOCUMENTS

| | | |
|---|---|---|
| EP | 2019415 A1 | 1/2009 |
| EP | 2187427 A2 | 5/2010 |
| EP | 2214194 A1 | 8/2010 |
| EP | 2317535 A2 | 5/2011 |
| EP | 2363875 A1 | 9/2011 |
| GB | 2349737 A | 11/2000 |
| JP | 08213301 A | 8/1996 |
| JP | 2006019436 A | 1/2006 |

(56) References Cited

FOREIGN PATENT DOCUMENTS

| JP | 2006332289 | | 12/2006 |
|---|---|---|---|
| WO | 2006084298 | A1 | 8/2006 |
| WO | 2008053140 | A1 | 5/2008 |
| WO | 2009147202 | | 12/2009 |
| WO | 2012172913 | A1 | 12/2012 |

OTHER PUBLICATIONS

European Search Report for Application No. 09450212.7, report dated Sep. 28, 2010, 9 pgs.
European Search Report for Application No. 14165967, report dated Oct. 30, 2014, 2 pgs.
European Search Report for Application No. 14165970, report dated Jun. 18, 2014, 2 pgs.
European Search Report for Application No. 14170611, report dated Nov. 4, 2014, 3 pgs.
European Search Report for Application No. 14176563, report dated Jan. 14, 2015, 2 pgs.
European Search Report for Application No. 14177851, report dated Oct. 16, 2014, 1 page.
European Search Report for Application No. 14199183, Report dated Jun. 19, 2015, 2 pgs.
European Search Report for Application No. 15164770, report dated Sep. 18, 2015, 2 pgs.
European Search Report for Application No. 15164772, report dated Sep. 11, 2015, 2 pgs.
European Search Report for Application No. 15169632, report dated Oct. 20, 2015, 3 pgs.
European Search Report for Application No. 15171348, report dated Oct. 30, 2015, 2 pgs.
European Search Report for Application No. 14176645, Report dated Dec. 1, 2014, 1 pg.
European Search Report for Application No. 08450077.6, report dated Jan. 29, 2010, 2 pgs.
European Search Report for Application No. 141501197.7, report dated Jun. 6, 2014, 2 pgs.
European Search Report for Application No. 10450070.7, Report dated May 7, 2012, 13 pgs.

Berry et al., "Programmable aperture plate for maskless high-throughput nanolithography", J. Vac. Sci. Technol., Nov./Dec. 1997, vol. B15, No. 6, pp. 2382-2386.
Borodovsky, Yan, "EUV, EBDW—ARF Replacement or Extension?", KLA-Tencor Lithography User Forum, Feb. 21, 2010, San Jose, CA, USA.
Borodovsky, Yan, "MPProcessing for MPProcessors", SEMATECH Maskless Lithography and Multibeam Mask Writer Workshop, May 10, 2010, New York, NY, USA.
Disclosed Anonymously, "Multi-tone rasterization, dual pass scan, data path and cell based vector format", IPCOM000183472D, printed from ip.com PriorArtDatabase, published May 22, 2009, 108 pages.
Kapl et al., "Characterization of CMOS programmable multi-beam blanking arrays as used for programmable multi-beam projection lithography and reisitless nanopatterning", Journal of Micromechanics and Microengineering, 21 (2001), pp. 1-8.
Li, H. Y. et al., "Through-Silicon Interposer Technology for Heterogeneous Integration", Future Fab Intl., Issue 45, Apr. 25, 2013.
Paraskevopoulos, A. et al., "Scalable (24-140 Gbps) optical data link, well adapted for future maskless lithography applications", Proc. SPIE vol. 7271, 72711 I, 2009.
Platzgummer, Elmar et al., "eMET POC: Realization of a proof-of-concept 50 keV electron multibeam Mask Exposure Tool", Proc. of SPIE vol. 8166, 816622-1, 2011.
Platzgummer, Elmar et al., "eMET—50keV electron Mask Exposure Tool Development based on proven multi-beam projection technology", Proc. of SPIE , vol. 7823, pp. 782308-1-782308-12.
Zhang et al., "Integrated Multi-Electron-Beam Blanker Array for Sub-10-nm Electron Beam Induced Deposition", J. Vac. Sci. Technol., Nov./Dec. 2006, vol. B24, No. 6, pp. 2857-2860.
European Search Report for Application 15159397.7, report dated Sep. 28, 2015, 8 pgs.
European Search Report for Application 15159617.8, report dated Oct. 19, 2015, 4 pgs.
Wheeler et al., "Use of Electron Beams in VlSI", G.E.C.Journal of Science and Technology, General Electric Company. Wembley, Middlesex, GB, vol. 48, No. 2, Jan. 1, 1982, pp. 103-107, XP000820522.

* cited by examiner

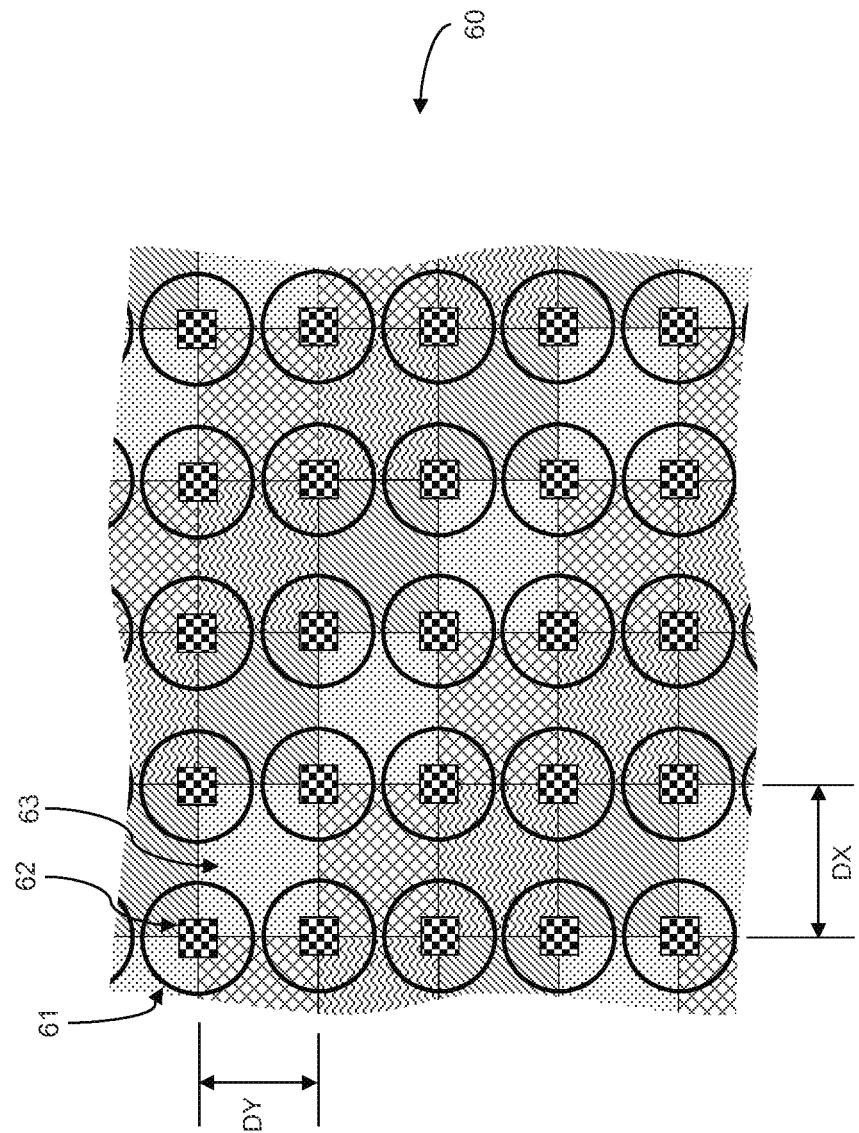

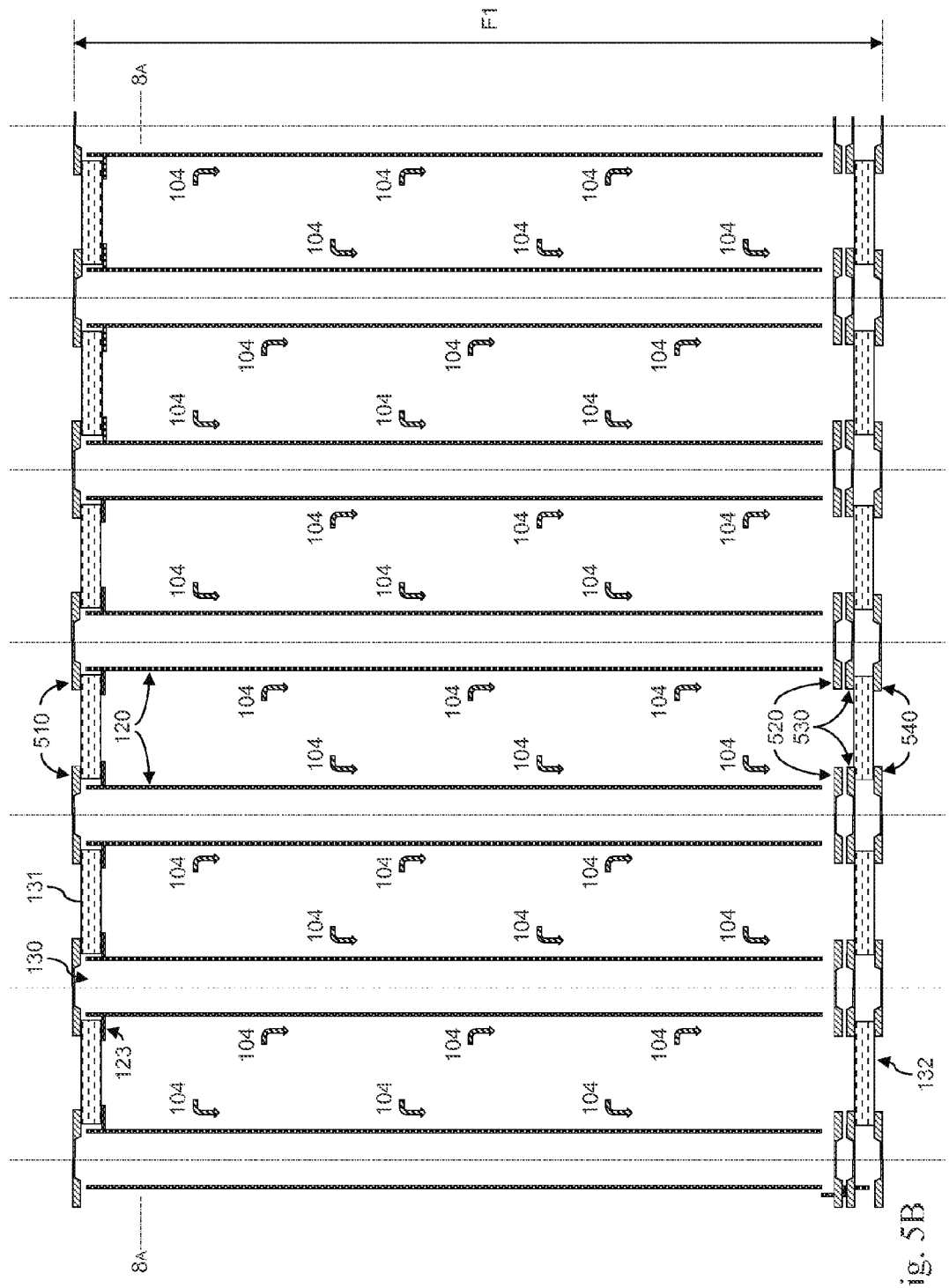

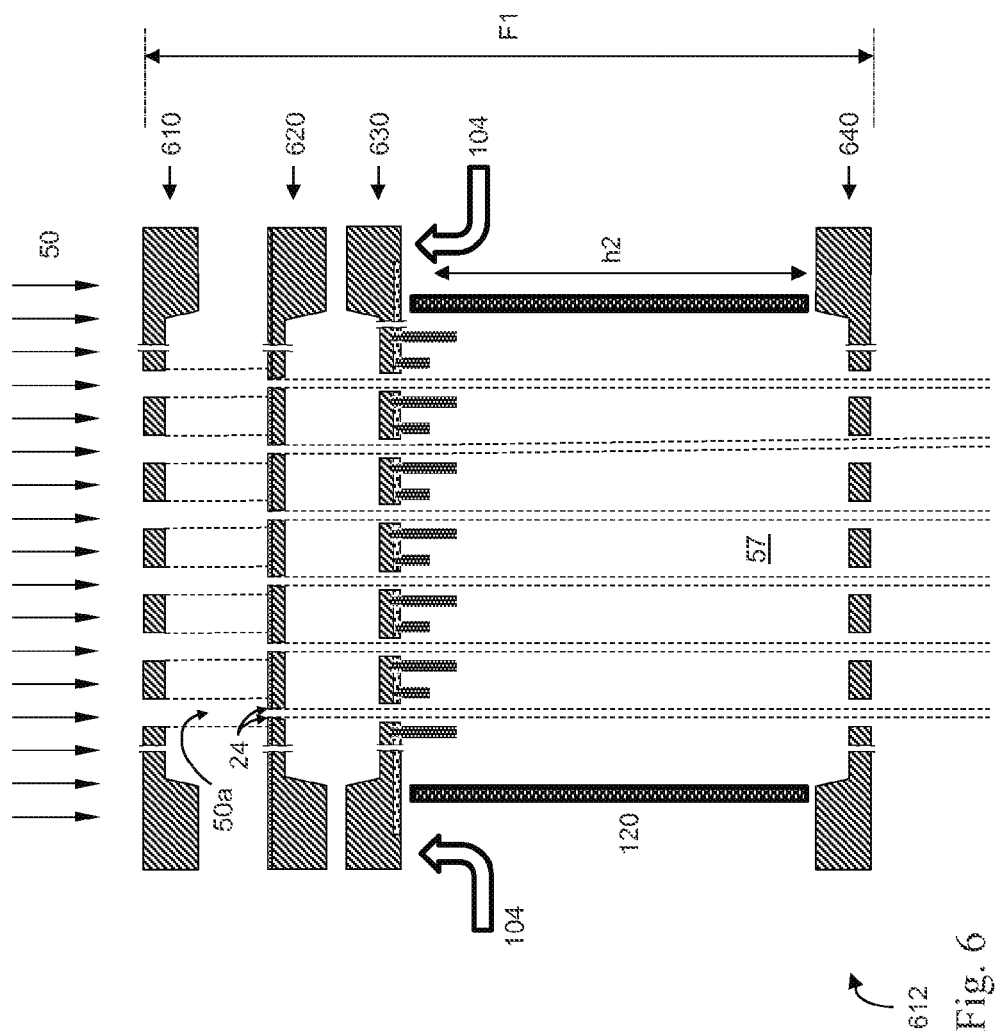

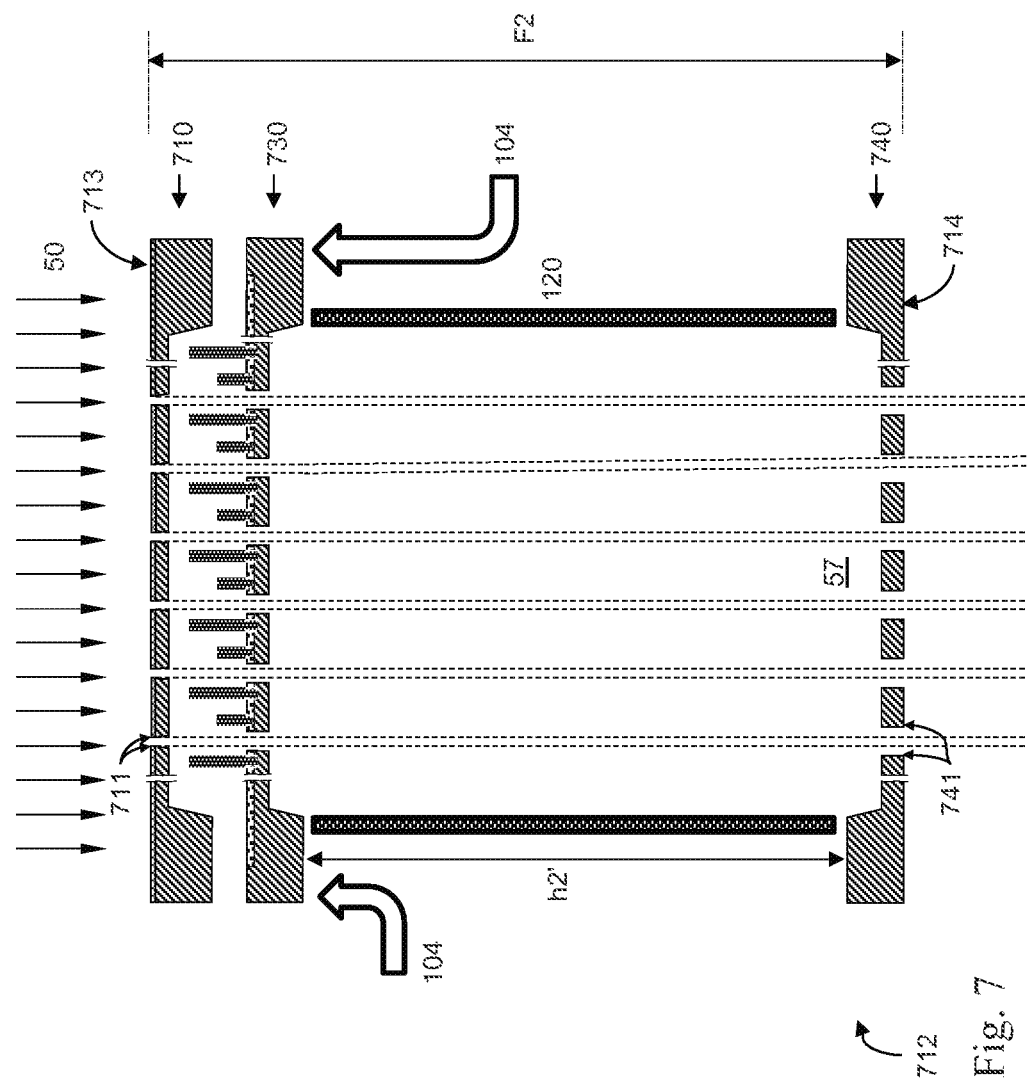

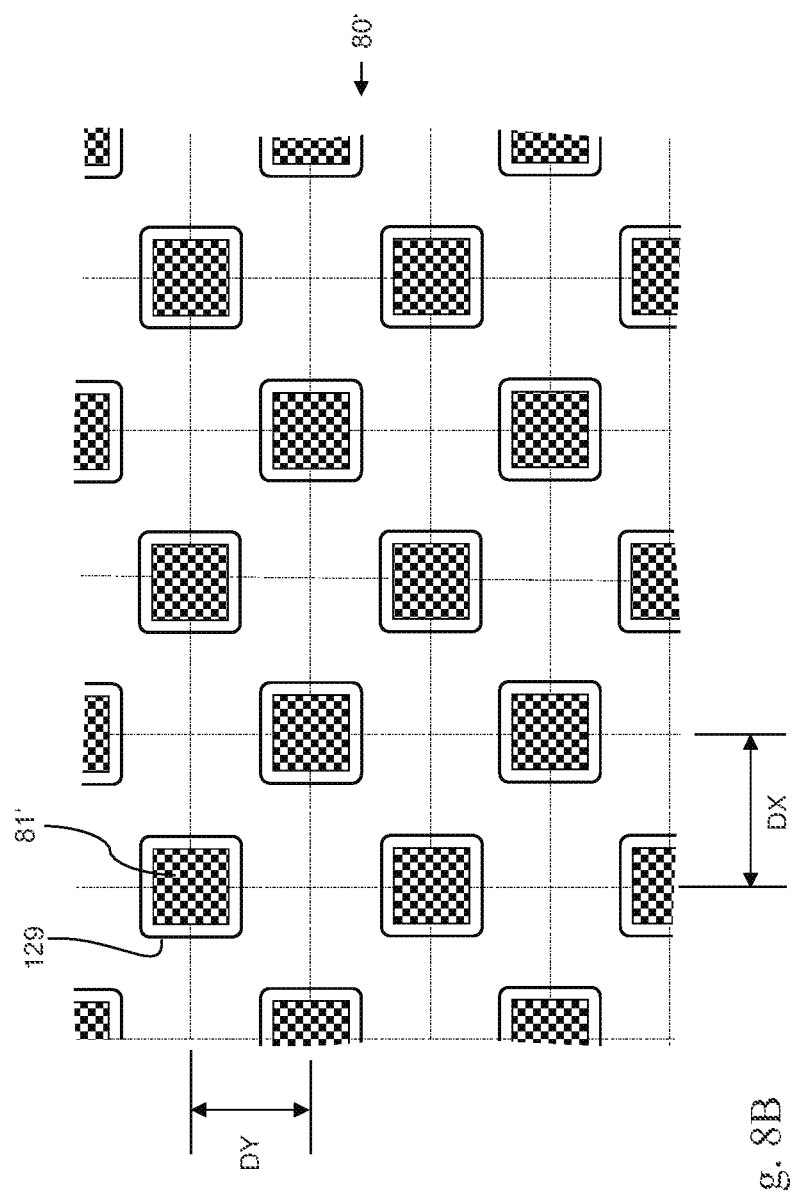

MULTI-BEAM TOOL FOR CUTTING PATTERNS

RELATED APPLICATION

The present application claims priority to European Application No. 14165970.6 filed Apr. 25, 2014, the disclosure of which is hereby incorporated by reference in its entirety.

BACKGROUND

The invention relates generally to a programmable charged-particle multi-beam apparatus for processing (in particular nanopatterning or semiconductor lithography) or inspection of a target.

SUMMARY OF THE INVENTION

In more detail, the invention generally relates to a charged-particle multi-beam processing apparatus for exposure of a target with a plurality of beams of electrically charged particles, comprising a plurality of particle-optical columns arranged parallel (along a Z direction) and configured for directing a respective particle beam towards the target, wherein each particle-optical column comprises an illumination system, a beam shaping device, and a projection optics system. The illumination system serves to produce a respective beam and form it into a (preferably, substantially telecentric) beam illuminating the shaping means. The beam shaping device is configured to form the shape of the illuminating beam into a desired pattern composed of a multitude of sub-beams, and includes an aperture array device provided with a multitude of apertures, each of said apertures defining the shape of a respective sub-beam having a nominal path towards the target, as well as a deflection array device for deflecting (only) selected sub-beams off their respective nominal path so that sub-beams thus selected do not reach the target; the remaining sub-beams represent the desired pattern being imaged to the target. The projection optics system serves to project an image of the beam shape defined in the shaping means onto the target.

Furthermore, the invention also generally relates to a beam shaping device (also called pattern definition device) for use in a column of such a charged-particle multi-beam processing apparatus, configured to be irradiated by an illuminating beam of electrically charged particles and to form the shape of the illuminating beam into a desired pattern composed of a multitude of sub-beams. This type of multi-column (or "multi-axis") configuration is described in U.S. Pat. Nos. 7,214,951 and 8,183,543 of the applicant.

Embodiments of several solutions and techniques suitable in the field of charged-particle multi-beam lithography and nanopatterning and pertinent technology have been developed, such as the following: when using ion multi-beams coined CHARPAN (charged particle nanopatterning) and when using electron multi-beams coined eMET (electron mask exposure tool) or MBMW (multi-beam mask writer) for mask writing, and coined PML2 (Projection Mask-Less Lithography) for direct write lithography on substrates, in particular silicon wafers. In this context, relevant patent documents in the name of the applicant are U.S. Pat. Nos. 7,199,373, 7,214,951, 8,304,749, 8,183,543, and 8,222,621.

FIG. 1 shows a schematic sectional view of a multi-column writer tool 1 in accordance with many embodiments with vacuum housing 10 for the multi-column charged-particle optics 2, a target chamber 3 onto which the multi-column charged-particle optics is mounted by means of by means of a column base plate 4. Within the target chamber 3 is an X-Y stage 5, e.g., a laser-interferometer controlled air-bearing vacuum stage onto which a substrate chuck 6 is loaded using a suitable handling system. The chuck 6, which preferably is an electrostatic chuck, holds the substrate 7, such as a silicon wafer. For charged-particle multi-beam lithography the substrate, for instance, is covered with an electron or ion beam sensitive resist layer 8.

The multi-column optics 2 comprises a plurality of sub-columns 9 (the number of columns shown is reduced in the depiction for better clarity, and represent a much larger number of columns that are present in the multi-column apparatus in a realistic implementation). Preferably, the sub-columns 9 have identical setup and are installed side-by-side with mutually parallel axes. Each sub-column has an illuminating system 11 including an electron or ion source 11a, an extraction system 11b, and an electrostatic multi-electrode condenser optics 11c, delivering a broad telecentric charged-particle beam to a pattern definition device (PDD) 12 being adapted to let pass the beam only through a plurality of apertures defining the shape of sub-beams ("beamlets") permeating said apertures (beam shaping device), and a demagnifying charged-particle projection optics 16 comprising three lenses. In the many embodiments shown, the first lens is an accelerating electrostatic multi-electrode lens 16a whereas the second and third lenses 16b, 16c are either magnetic lenses, in particular when using electrons, or electrostatic lenses, for instance in the case where the particles are ions, as outlined in U.S. Pat. No. 7,214,951.

The accelerating first lens of the projection charged-particle optics 16 provides the important advantage of operating the PDD 12 at low kinetic energy of the particles (e.g., 5 keV) whereas providing high beam energy (e.g., 50 keV) at the cross-overs of the demagnifying projection optics, thus minimizing stochastic Coulomb interactions. Further, the high beam energy at the substrate is beneficial to reduce forward scattering of the charged particles when exposing the target, in particular the charged-particle sensitive layer 8.

The first lens of the projection optics forms a first cross-over whereas the second lens forms a second cross-over. At this position in each sub-column there is a stopping plate 15 configured to filter out beams deflected in the PDD. The third lenses 16c of the sub-columns as well as the stopping plates 15 are mounted onto a reference plate 17 which is mounted by suitable fastening means 18 onto the column base plate 4. Mounted onto the reference plate 17 are parts 19 of an off-axis optical alignment system.

The reference plate is fabricated from a suitable base material having low thermal expansion, such as a ceramic material based on silicon oxide or aluminum oxide, which has the advantage of little weight, high elasticity module and high thermal conductivity, and may suitably be covered with an electrically conductive coating, at least at its relevant parts, in order to avoid charging (by allowing electrostatic charges being drained off).

As can be seen in the longitudinal sectional detail of FIG. 2, a PDD 12 according to prior art comprises three plates stacked in a consecutive configuration. An aperture array plate 20 (AAP), a deflection array plate 30 (DAP, also referred to as blanking array plate) and a field-boundary array plate 40 (FAP). It is worthwhile to note that the term 'plate' is refers to an overall shape of the respective device, but does not necessarily indicate that a plate is realized as a single plate component even though the latter is usually the preferred way of implementation; still, in certain embodiments, a 'plate', such as the AAP, may be composed of a number of sub-plates. The plates are preferably arranged parallel to each other, at mutual distances along the Z direction.

The flat upper surface of AAP 20 forms a defined potential interface to the condenser optics 11. The AAP may, e.g., be made from a square or rectangular piece of a silicon wafer (approx. 1 mm thickness) 21 with a thinned center part 22. The plate may be covered by an electrically conductive protective layer 23, which will be particularly advantageous when using hydrogen or helium ions (line in U.S. Pat. No. 6,858,118). When using electrons or heavy ions (e.g., argon or xenon), the layer 23 may also be silicon, provided by the surface section of 21 and 22, respectively, so that there is no interface between layer 23 and bulk parts 21/22, respectively.

The AAP 20 is provided with a plurality of apertures 24 formed by openings traversing the thinned part 22. In the embodiments shown the apertures 24 are realized having a straight profile fabricated into the layer 23 and a "retrograde" profile in the bulk layer of the AAP 20 such that the downward outlets 25 of the openings are wider than in the main part of the apertures 24. Both the straight and retrograde profiles can be fabricated with state-of-the-art structuring techniques such as reactive ion etching. The retrograde profile strongly reduces mirror-charging effects of the beam passing through the opening.

The DAP 30 is a plate provided with a plurality of openings 33, whose positions correspond to those of the apertures 24 in the AAP 20, and which are provided with electrodes 35, 38 configured for deflecting the individual sub-beams passing through the openings 33 selectively from their respective paths. The DAP 30 can, for instance, be fabricated by post-processing a CMOS wafer with an ASIC circuitry. The DAP 30 is, for instance, made from a piece of a CMOS wafer having a square or rectangular shape and comprises a thicker part 31 forming a frame holding a center part 32 which has been thinned (but may be suitably thicker as compared to the thickness of 22). The aperture openings 33 in the center part 32 are wider compared to 24 (by approx. 2 μm at each side for instance). CMOS electronics 34 is used to control the electrodes 35, 38, which are provided by means of MEMS techniques. Adjacent to each opening 33, a "ground" electrode 35 and a deflection electrode 38 are provided. The ground electrodes 35 are electrically interconnected, connected to a common ground potential, and comprise a retrograde part 36 to prevent charging and an isolation section 37 in order to prevent unwanted shortcuts to the CMOS circuitry. The ground electrodes 35 may also be connected to those parts of the CMOS circuitry 34 which are at the same potential as the silicon bulk portions 31 and 32.

The deflection electrodes 38 are configured to be selectively applied an electrostatic potential; when such electrostatic potential is applied to an electrode 38, this will generate an electric field causing a deflection upon the corresponding sub-beam, deflecting it off its nominal path. The electrodes 38 as well may have a retrograde section 39 in order to avoid charging. Each of the electrodes 38 is connected at its lower part to a respective contact site within the CMOS circuitry 34.

The height of the ground electrodes 35 is higher than the height of the deflection electrodes 38 in order to suppress cross-talk effects between the beams.

The third plate 40 serving as FAP has a flat surface facing downstream to the first lens part of the demagnifying charged-particle projection optics 16, thus providing a defined potential interface to the first lens 16a of the projection optics. The thicker part 41 of FAP 40 is a square or rectangular frame made from a part of a silicon wafer, with a thinned center section 42. The FAP 40 is provided with a plurality of openings 43 which correspond to the openings 24, 33 of the AAP 20 and DAP 30 but are wider as compared to the latter.

The PDD 12, and in particular the first plate of it, the AAP 20, is illuminated by a broad charged particle beam 50 (herein, "broad" beam means that the beam is sufficiently wide to cover the entire area of the aperture array formed in the AAP), which is thus divided into many thousands of micrometer-sized beams 51 when transmitted through the apertures 24. The beams 51 will traverse the DAP and FAP unhindered.

As already mentioned, whenever a deflection electrode 38 is powered through the CMOS electronics, an electric field will be generated between the deflection electrode and the corresponding ground electrode, leading to a small but sufficient deflection of the respective beam 52 passing through (FIG. 2). The deflected beam can traverse the DAP and FAP unhindered as the openings 33 and 43, respectively, are made sufficiently wide. However, the deflected beam 52 is filtered out at the stopping plate 15 of the sub-column (FIG. 1). Thus, only those beams which are unaffected by the DAP will reach the substrate.

The reduction factor of the demagnifying charged-particle optics 16 is chosen suitably in view of the dimensions of the beams and their mutual distance in the PDD 12 and the desired dimensions of the structures at the target. This will allow for micrometer-sized beams at the PDD whereas nanometer-sized beams are projected onto the substrate.

The ensemble of (unaffected) beams 51 as formed by AAP is projected to the substrate with a predefined reduction factor R of the projection charged-particle optics. Thus, at the substrate a "beam array field" (BAF) is projected having widths BX=AX/R and BY=AY/R, respectively, where AX and AY denote the sizes of the aperture array field along the X and Y directions, respectively. The beam size of an individual sub-beam at the substrate is given by bX=aX/R and by=aY/R, respectively, where aX and aY denote the sizes of the beam 51 as measured along the X and Y directions, respectively, at the level of the DAP 30.

It is worthwhile to note that the individual beams 51, 52 depicted in FIG. 2 (as well as in the analogous figures below) represent a much larger number of sub-beams, typically many thousands, arranged in a two-dimensional X-Y array. The applicant has, for instance, realized multi-beam charged-particle optics with a reduction factor of R =200 for ion as well as electron multi-beam columns with many thousands (e.g., 262,144) programmable beams. The applicant has realized such columns with a beam array field of approx. 82 μm×82 μm at the substrate. These examples are stated for illustrative purpose, but are not to be construed as limiting examples.

The arrangement outlined in FIGS. 2 is used to implement sub-columns with such a diameter that a large number of sub-columns of the above-described kind fit within the area of a substrate, such as a 300 mm silicon wafer used as a substrate for leading-edge integrated circuit device production. There is ongoing development of 193 nm immersion optical lithography, EUV and nano-imprint lithography tools for 450 mm silicon wafer size. Without loss of throughput, the multi-column configuration as presented here can easily be adapted to any other wafer size, such as a 450 mm diameter silicon wafer size, by providing a corresponding higher number of sub-columns.

The recent progress of integrated circuits, in particular microprocessors, was made possible not only by novel lithographic, deposition, and etching techniques, but also by innovative circuit design. A most powerful innovation was to proceed from a two-dimensional to a one-dimensional circuit design, as was described by Yan Borodovsky in "EUV, EBDW—ARF Replacement or Extension?", KLA-Tencor Lithography User Forum, Feb 21, 2010, San Jose, Calif., USA, as well as "MPProcessing for MPProcessors", SEMATECH Maskless Lithography and Multibeam Mask Writer Workshop, May 10, 2010, New York, N.Y., USA. For this end regular line patterns are fabricated using e.g., 193 nm (water) immersion optical lithography, layer deposition and etching steps, and then "complementary lithography" exposure and subsequent etching steps are performed to generate cuts in the regular line pattern according to a desired structured line pattern.

To date development of EUV (extended ultra-violet) lithography, based on 13.5 nm wavelength, is delayed, and therefore, in 2015 there will be the necessity to expose the cutting pattern with 193 nm immersion optical lithography. As the minimum pitch for this technique is ca. 80 nm. As a consequence there is the need to expose the cutting pattern with 4 different masks (cf. Yan Borodovsky in KLA-Tencor Lithography User Forum op.cit.). Thus, in the context of EUV lithography there is a need for new techniques allowing to expose the cutting pattern on the mask with one mask only. Therefore, there is continued strong industrial interest in EUV lithography, even though it might not be ready for production at the 10 nm logic node. Still, there are major hurdles for EUV lithography to overcome, which is why the semiconductor industry is increasingly and seriously interested in alternative lithographic possibilities for cutting pattern exposure. Nano-imprint lithography is one possibility but there are several difficulties, such as master template fabrication, lifetime of working stamp replicas, defect inspection and repair of the stamps, and the possible occurrence of defect generation during imprinting. As another alternative, electron multi-beam direct write has obtained increasing industrial attention because it offers sub-10 nm resolution potential and no masks are needed.

Evidently, the multi-column layout described above requires that, in order to properly control the multitude of deflector devices in the DAPs 30 of the multicolumn apparatus, a large number of data and controlling signals are supplied as input signals to the DAPs. Further, additional control lines for reading out the deflector devices may be present to provide output signals. These input and output lines of the DAPs are referred to as 'data path'.

The layout of the multi-column apparatus underlying many embodiments of the invention, such as the one illustrated in FIG. 1, has a compact arrangement where the charged-particle optical columns are positioned closely together, which is advantageous with respect to its ability to perform writing and structuring patterns onto the target in an efficient manner; however, this compact arrangement makes it highly difficult to provide data path access to the plurality of sub-columns. This is because the compact arrangement of the sub-columns leaves only little space between them through which the required data lines can pass; further aggravating this problem is that the data lines forming the data path are of a considerable number, since for each aperture field data must be supplied to each row of apertures simultaneously. Therefore, it is an aim of many embodiments of the invention to provide access possibilities for the data path from the sides of the PDDs of the sub-columns, without the need of modifying—and very likely deteriorating—the optical properties of the highly optimized lens elements.

This aim is met by a beam shaping device, as well as a charged-particle multi-beam processing apparatus incorporating such a beam shaping device layout, wherein the beam shaping device is provided with
  a first field-boundary device as the first element of the respective beam shaping device traversed by the beam, the first field-boundary device having a first surface oriented towards the illumination system,
  a second field-boundary device as the last element of the respective beam shaping device traversed by the beam, the second field-boundary device having a second surface oriented towards the projection optics system, and the first and/or second field-boundary devices define—i.e., delimit—a field-free space interval within the respective beam shaping device, which field-free space interval is configured to accommodate feeding lines for controlling the deflection array device of the respective beam shaping device (i.e., the data path lines). The field-free space interval includes at least the free space which is formed between the respective first or second field-boundary device and a consecutive component devices of the beam shaping device, which preferably are plate-shaped components of the beam shaping device, such as the mentioned aperture array device or deflection array device. Herein "consecutive component device" is understood to mean a component device which is located adjacent but at a distance to the relative field-boundary device within the beam shaping device.

This solution creates sufficient space for the data path access while maintaining a compact arrangement of the multiple columns. The compact arrangement is key to achieve high throughput. Many embodiments of the invention allow for the accommodation of the feeding lines which realize the data path access within the field-free space and separately from the deflection array device, and possibly also separately from the other component devices of the beam shaping device as well. Further, the embodiments of the invention facilitate effective cooling of the PDDs to keep them at a desired temperature within a narrow tolerance range.

According to an advantageous development of many embodiments of the invention, the feeding lines (i.e., the data path lines) may come at multiple levels of height with regard to the Z direction within the field-free space interval. This reduces the space the lines need within a given X-Y plane, thus reducing the need for space.

Another possible aspect of many embodiments of the invention may provide for shielding tubes which shield the sub-beams and the data path lines against each other. Thus, each shielding tube may be locate within a respective beam shaping device in the respective field-free space, entirely surrounding the beam traversing the respective beam shaping device. The shielding tube will be made of a material suitable to provide a magnetic and/or electric shielding of the beam. Their shape will usually be a generally cylindrical or prismatic shape coaxial with the Z direction, which includes shapes of circular, oval, polygonal and rounded-polygonal cross-sections, such as squares or rectangles with rounded corners.

In one particularly advantageous development in accordance with embodiments of the invention the first and/or second field-boundary devices are arranged at a distance (along the Z direction) to the other components of the respective beam shaping device, so as to provide a field-free space with regard to electric fields within the respective pattern definition device, wherein the dimension of this distance is chosen so as to be sufficient for accommodating the feeding lines.

In one typical implementation according to embodiments the first field-boundary device will be a device separate from the aperture array device of the respective column, so as to allow a separation of the functions and facilitate replacement processes of worn out components. However, the first field-boundary device may be realized by the aperture array device of the respective column, which will reduce the number of components.

According to a suitable implementation of embodiments of the invention, the first and second field-boundary devices are realized as generally plate-shaped components, which may further be arranged parallel to each other and at a mutual distance along the Z direction.

In another advantageous development of embodiments of the invention, the DAPs may be located at different Z locations ("tiers"). In this case, the first field-boundary devices of the columns are arranged at a uniform first height with regard to the Z direction, and the second field-boundary devices of the columns are arranged at a uniform second height; for each column a blanking unit including the respective deflection array device is arranged at a height level different from the height levels of the blanking unit of the columns adjacent to the respective column. Thus, the blanking units/the deflection array devices are arranged at a number of height levels between the first and second heights.

The first and second field-boundary devices will include respective arrays of openings that correspond to the apertures of the aperture array device of the respective column. Advantageously, these first and second surfaces may be flat with the exception of the respective array of openings, so as to define a clear limiting surface vis-à-vis the illuminating system and/or the projection system.

BRIEF DESCRIPTION OF THE DRAWINGS

In the following, several embodiments of the present invention are described in more detail with reference to the drawings, which illustrate several embodiments of the invention given by way of example and representing suitable implementations of the invention, which are not to be construed as restrictive to invention. The drawings schematically show:

FIG. 3A shows a first arrangement of the columns with regard to the target in a partial plan view (rectangular arrangement);

FIG. 5B shows how several PDDs of the type shown in FIG. 5A are arranged in parallel in the tool of FIG. 4;

FIG. 6 shows a PDD according to other embodiments;

FIG. 7 shows a PDD according to further embodiments;

FIG. 8B depicts PDDs in a cross sectional view detail like that of FIG. 8A, but in a rhombic arrangement;

DETAILED DESCRIPTION

The various embodiments shown in the following relate to a multi-beam tool for cutting patterns used for mix-and-max lithography, where the substrate (e.g., silicon wafer) is exposed e.g., with a 193 nm immersion scanner tool with die-fields having length DX and width DY of typically DX=33 mm and DY=26 mm. One die field may, and typically will, comprise several chips. The many embodiments are not limiting, and thus the invention may refer to other layouts and applications as well. Within this disclosure, the terms "upper", "lower" and related terms like "top" or "bottom" are to be understood with regard to the direction of the beam, which is thought to run downwards along a "vertical" axis. This vertical axis, in turn, is identified with the Z direction (longitudinal direction), to which the X and Y directions are transversal.

Figure 3B:
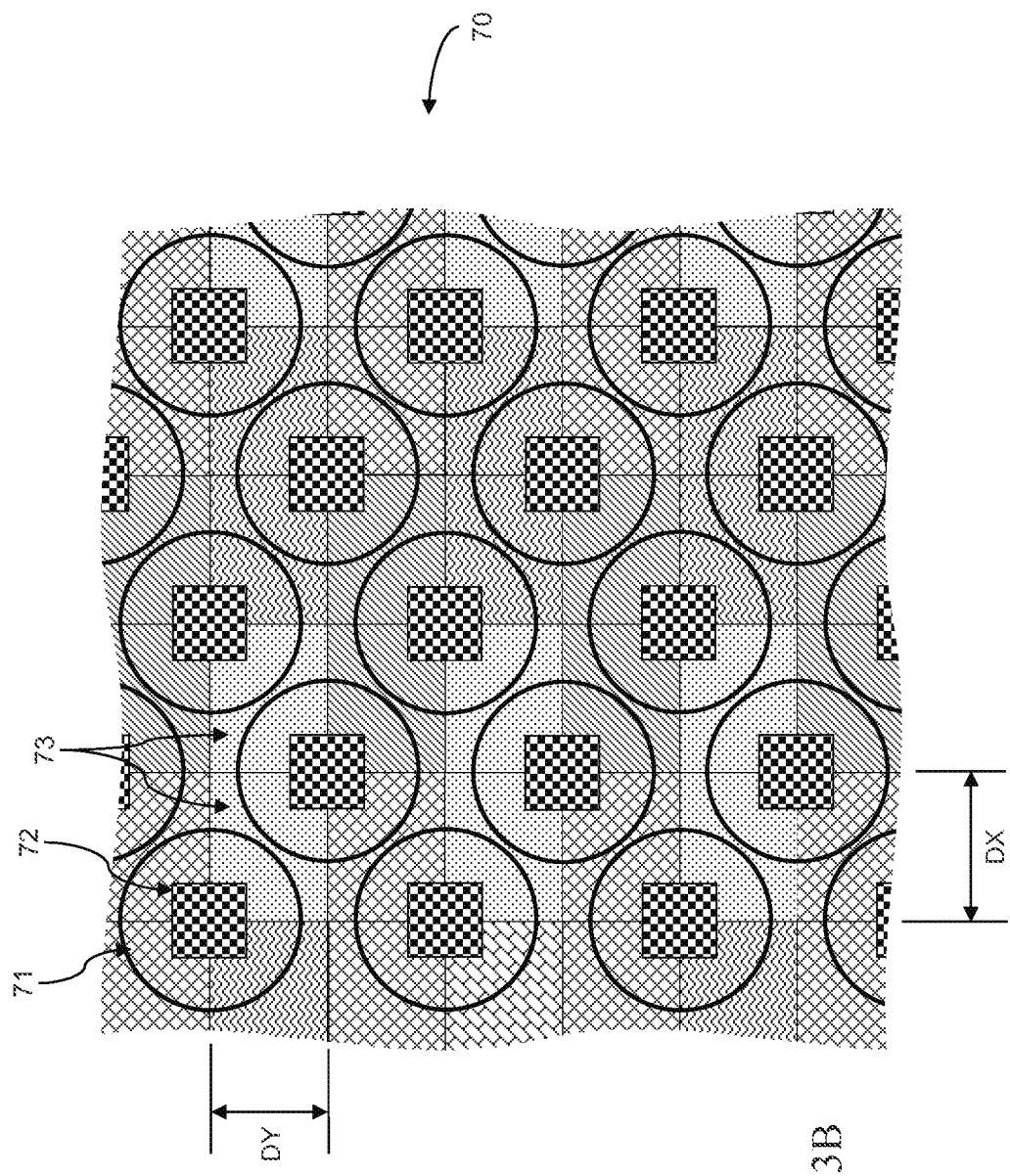
FIG. 3B shows a second arrangement of the columns (rhombic arrangement)

Examples of embodiments of compact sub-columns arrangements 60 and 70 suitable for the invention are shown in FIGS. 3A and 3B, respectively, which show plan view details of the arrangements with regard to the plane of the target. In FIG. 3A a "rectangular" layout is depicted, wherein one sub-column 61 (symbolically represented by a circle) with an aperture array field 62 is respectively used to expose the area 63 of one die field (as illustrated by different ways of hatching); consequently, the mutual arrangement of columns reflected the mutual arrangement of the die fields. FIG. 3B illustrates a "rhombic" arrangement of the columns, where one sub-column 71 with an aperture array field 72 is respectively used to expose the area 73 of two die fields, and the distance between two neighboring columns corresponds to a diagonal of a single die field.

Assuming DX=33 mm and DY=26 mm, then in case of FIG. 3A the diameter of a sub-column 61 is approx. 24 mm and the size of the aperture array field 62 is approx. 8.2 mm×8.2 mm, whereas in case of FIG. 3B the diameter of a sub-column 71 is approx. 40 mm and the aperture array field 72 is approx. 16.4 mm×16.4 mm. Assuming the periodicity of the apertures is 16 μm, the aperture array field 62 is able to provide 512×512=262,144 beams, whereas the aperture array field 72 is able to provide 1024×1024=1,048,576 beams.

The aperture array field may also, in a variant, be chosen to be rectangular, preferably having the same diagonal length as a corresponding square aperture array field.

As mentioned above, a large number of input signals, which include data and controlling signals for the DAPs (or in general, the beam shaping devices of the columns), as well as output signals from the deflector devices and other control sensors, need to be supplied as data path to and from the DAPs (beam shaping devices). However, the compact arrangement of the sub-columns causes a space problem for the data path. The many embodiments of the invention solve this problem, i.e., supplying additional space within the arrangement of the PDD device, by providing a first second field-boundary device and a second field-boundary device as first and last components of the PDD, which serves as field boundaries against the electromagnetic fields of the illumination system 11 and the projection optics system 16, respectively. Thus, the first and second field-boundary device define a "free drift region" between them, which is protected against the high electric and magnetic fields of the particle optical systems 11 and 16. It should be noted, however, that this "free drift region" will contain the transversal fields of the deflecting devices in the DAPs, which of course are only local and of limited spatial extension. In particular, one or both of the field-boundary devices is positioned at a substantial distance to the preceding and/or subsequent plate component of the PDD, creating a field-free space through which the beam can travel undisturbed, and which creates a space allowing sufficient access possibilities for the data path 101 entering from the sides of the particle optical columns 9 towards the DAPs.

Figure 1:
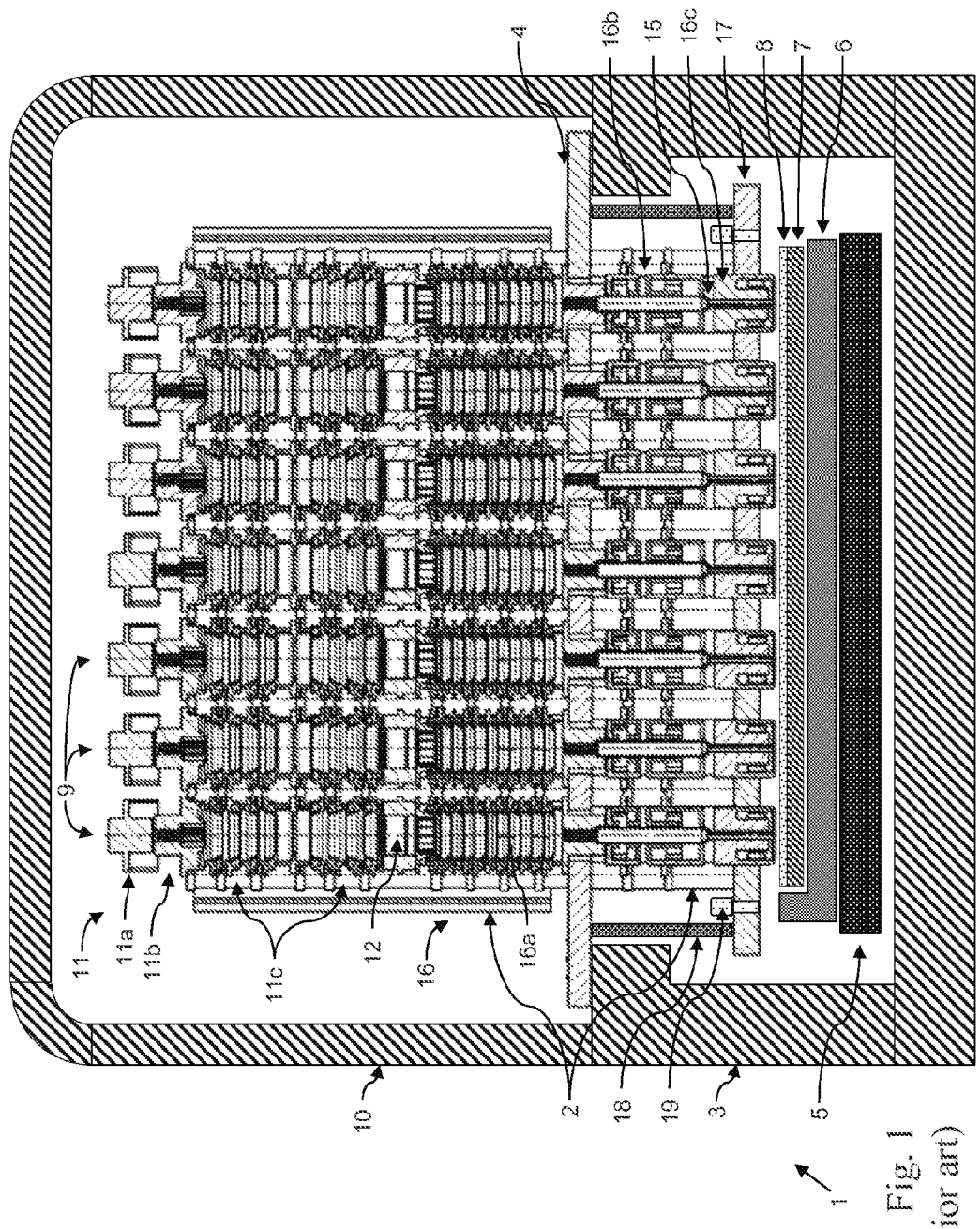
FIG. 1 a multi-column writer tool in a schematic sectional view in accordance with many embodiments.
Figure 4:
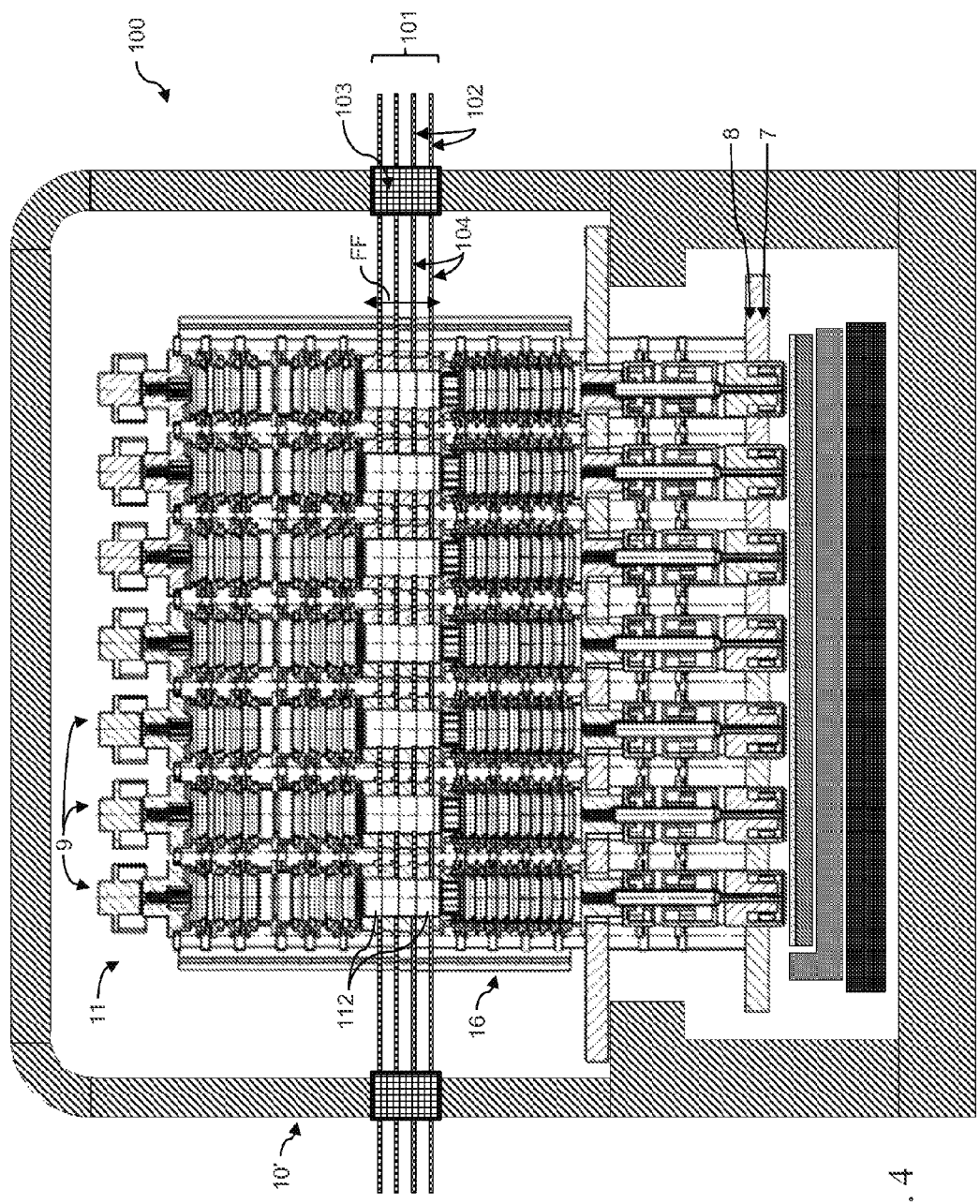
FIG. 4 illustrates a multi-column writer tool incorporating an embodiment of the invention in a sectional view.

FIG. 4 illustrates an embodiment of the invention in a sectional view corresponding to FIG. 1. The apparatus 100 comprises a free-drift region FF between the condenser optics 11 and the projection optics 16. In this free-drift region FF, the (high) electric fields of the charged-particle optical systems 11 and 16 are shielded off so as to guard the data path lines as well as the local deflection devices. Furthermore, the free-drift region FF has a considerably enhanced height as compared to that of a single PDD 112 of FIG. 1. The large free-drift region FF advantageously offers the possibility of sufficient access of the data path 101 regardless of the large number of lines contained therein. The data path 101 comprises a number of line bundles 102, which enter through vacuum locks 103 into the vacuum chamber 10'; a vacuum portion 104 of the data path/line bundles reaches the respective PDDs 112 and feeds the data to the PDDs of the individual columns 9.

The data path comprises, for instance, fiber optical and/or electrical line components (e.g., flatband cables) as known in prior art. An implementation of an optical data path suitable for embodiments of the invention is described in the article of A. Paraskevopoulos et al., "Scalable (24-140 Gbps) optical data link, well adapted for future maskless lithography applications", Proc. SPIE Vol. 7271, 72711 I (2009). These techniques can be combined with modern packaging techniques, in particular using suitable connections such as flip-chip bonding instead of using bonding wires to the DAP as outlined below in more detail.

Figure 5A:
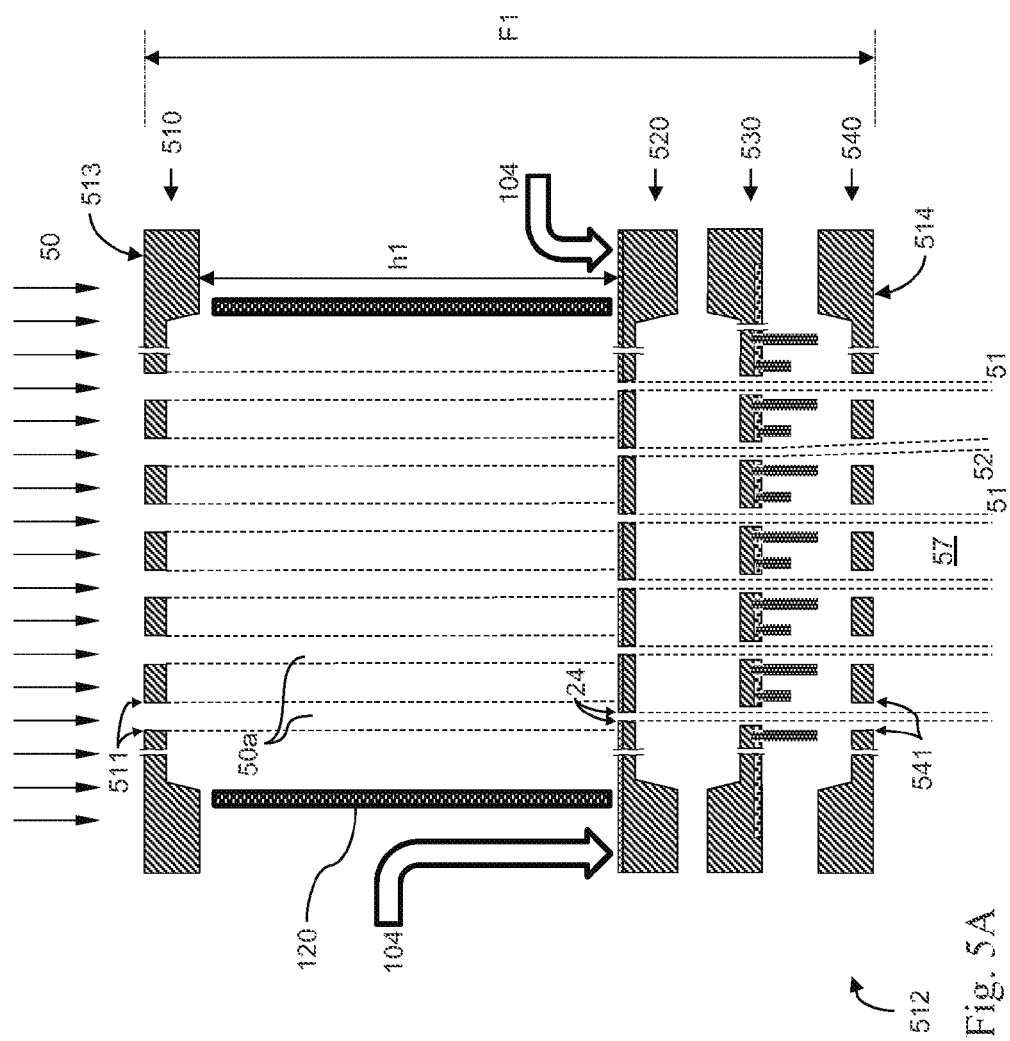
FIG. 5A shows a PDD according to an embodiment.

FIG. 5A illustrates one realization of a PDD arrangement 512 serving as one of the beam shaping devices 112 of the apparatus 100 of FIG. 4, in a longitudinal sectional detail view. In addition to the AAP 520 and DAP 530, an additional plate 510 is provided as a first plate (i.e., topmost plate) of the PDD arrangement 512, as well as a plate 540 as a lowermost plate of the PDD arrangement 512 as seen along the direction of the beam. The plate 510 realizes a first field-boundary device according to embodiments of the invention, and is referred to as first or top field-boundary array plate, abbreviated tFAP (or top FAP); likewise, the plate 540 realizes a second field-boundary device according to embodiments of the invention, referred to as second or bottom field-boundary array plate, abbreviated bFAP (or bottom FAP; "bottom" referring to the position as lowermost plate of the PDD). In an embodiment shown in FIG. 5A, the tFAP 510 is at a considerable distance h1 to the AAP 520 and the subsequent DAP 530 and bFAP 540. The tFAP 510 and bFAP 540 define a free-drift region F1 between them, more exactly between the outwardly facing surfaces 513, 514 of the FAPs 510, 540. Preferably, the surfaces 513, 514 are flat except for the aperture openings 511, 541 provided in the plates so as to allow passage of the illuminating beam 50a through the PDD arrangement 512, as a multitude of sub-beams 57. The aperture openings 511 in the tFAP 510 may have the same size as the corresponding aperture openings 541 of the bFAP 540, or a similar size, under the condition that they are larger than the apertures 24 of the AAP 520. Thus, the sub-beams 50a formed by the tFAP are larger compared to the aperture opening size 24 of the AAP, which define the ultimate shape of the individual sub-beams 51, 52.

The enhanced height of the free-drift region F1 allows the adequate access of data path lines 104 to the DAP 530, as described in more detail below. A large distance h1 is present between two subsequent plates, here the tFAP 510 and AAP 520. This distance h1, on the one hand, creates a field-free space for the sub-beams 50a in the areas of the aperture fields, and on the other hand outside of the regions of the sub-beams (i.e., between the columns) it offers sufficient space for the data path lines 104 supplying the DAPs 530. The arrows 104 symbolize data path bundles which approach the PDD arrangement at one or more levels of height and enter the respective DAP passing the corresponding AAP (bypassing the outer rim of the AAP and/or traversing through-holes provided therein). The deflection devices of the DAP may be oriented downstream as shown in FIG. 5A or upstream (cf. FIG. 7) without this having an effect upon the layout according to embodiments of the invention.

The field-free space interval formed by the distance h1 is a region of evacuated space inside the optical column, not obstructed by mechanical components. It is, therefore, suitable for the beam path of the charged particles near the axis of the optical column, and for accommodating feeding lines in the off-axis regions which are not traversed by the charged particles. The field-free space is, as its name insinuates, essentially free of electromagnetic fields, in particular of free of fields that are technically generated. The latter—i.e., the absence of technically generated electromagntic fields—is achieved by means of the FAPs field-boundary devices. As mentioned above, the bFAP and tFAP are held at a common electrostatic potential (usually reference ground potential), and as a consequence the space or "interval" between those two plate-like devices is free from technically generated electrostatic fields, including in particular the electrostatic fields of the charged-particle optical systems 11 and 16.

Other fields such as magnetic fields are avoided by avoiding their sources ( magnetic materials, conductive elements carrying a current). Furthermore, a magnetic field shielding tube 120 may be provided, positioned in the field-free space formed by the distance h1 between the tFAP 510 and AAP 520 and surrounding the sub-beams 50a traversing this region. The tube 120 is made of a material suitable for magnetic shielding, such as mu-metal with a thickness of approx. 1 mm. The shape of the tube 120 preferably is a cylindrical/prismatic shape derived from a suitable cross-section shape, extending along the Z direction so as to be parallel to the beam. This magnetic field shielding tube 120 helps to avoid cross talk of the beams between the sub-columns, as described in more detail below. Other embodiments (not shown) may be realized without magnetic field shielding tubes.

FIG. 5B shows a number of PDD arrangements of the type shown in FIG. 5A, in its parallel arrangement within the apparatus 100. The tFAPs are mounted on a common base plate 131. The base plate 131 is made of a base material like that of the reference plate, and extends through the entire width of the multi-column device, provided with holes 130 at the positions of the individual columns 9. In a similar manner, the bFAPs are mounted on a common base plate 132, preferably made of the same base material. The AAPs and DAPs are mounted on respective positions of the inner surface of a base plate as well, in this case of the second base plate 132. The data path is supplied in one or more portions 104 to the individual DAPs 530, possibly at different levels of height, illustrating the improved space situation by virtue of the embodiments of the invention. FIG. 5B also illustrates one possible realization of the attachment of the shielding tubes 120 within the PDD arrangement; in this case, each tube 120 is fixed at its upper end to the inner rim of the corresponding hole 130 in the base plate 131 by means of suitable attachment devices 123.

The base plates 131, 132 may further include a cooling system as a way to control the temperature of the plates 510, 520, 530, 540 mounted on them. The cooling system may be realized, for instance, by a number of vacuum-tight coolant lines formed in the base plates, which lines are connected to a coolant supply.

FIG. 6 shows another embodiment of a PDD arrangement 612 where the AAP 620 is in proximity to the tFAP 610 while the DAP 630 is positioned between the bFAP 640 and the AAP 620 (preferably in close vicinity of the latter), leaving a large distance h2 above the bFAP 640. Again a magnetic field shielding tube 120 is provided, in this case located in the field-free space formed by the large distance h2 between the DAP and bFAP. The data path 104 is supplied to the DAP via the space formed by the large distance outside the shielding tube 120.

FIG. 7 shows a further embodiment of a PDD arrangement 712 where the AAP 710 is the first plate and thus also realizes the first field-boundary device of embodiments of the invention. Consequently, in this case the free-drift region F2 is formed between the upper surface 713 of the AAP 710 and the lower surface 714 of a bFAP 740. In this case the apertures 711 of the AAP 710 formed in the surface 713 define the shape of the sub-beams 57. The aperture openings of the other plates, in particular the corresponding aperture openings 741 of the bFAP 740, are suitably wider than the apertures 711. The data path 104 is supplied via the space which, in this case, is defined by the large distance h2' between the DAP 730 and the bFAP 740.

Figure 2:
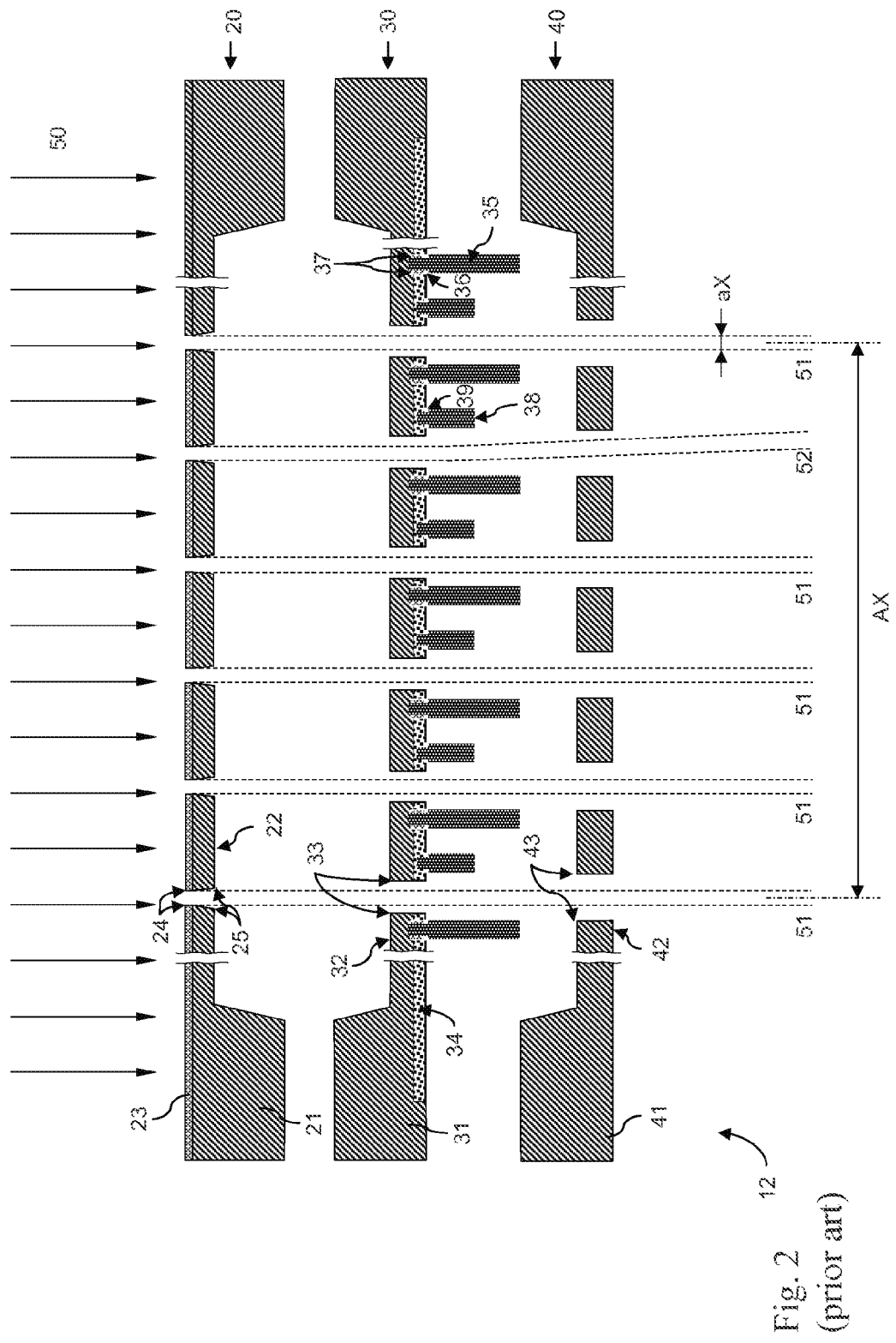
FIG. 2 is a longitudinal sectional view of a PDD of one of the columns of the tool of FIG. 1.

In each variant of the PDD arrangement, the orientation of the DAP may be with the ground and deflection electrodes 35, 38 oriented downstream ("inverted" orientation as shown in FIGS. 2 and 5A), or with the electrodes oriented upstream ("upright" orientation, see FIG. 7); the orientation can be chosen as deemed suitable for each case. Further DAP configurations, e.g., with embedded ground and deflection electrodes, can easily be devised by the skilled person (see other patents in the name of the applicant, such as U.S. Pat. No. 8,198,601 B2).

Figure 8A:
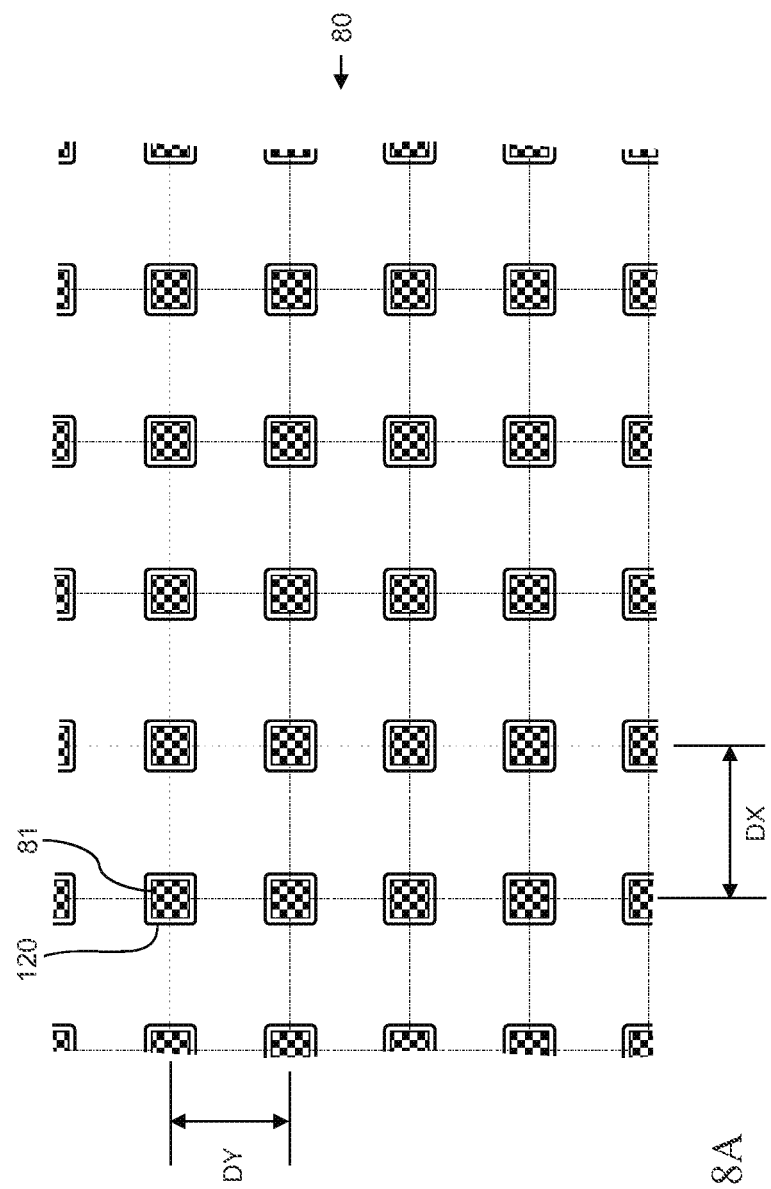
FIG. 8A depicts several PDDs in a rectangular arrangement, in a cross sectional view detail along line 8A-8A in FIG. 5B.

FIG. 8A shows a cross sectional view of the PDDs of several adjacent columns, along a transversal sectional plane as indicated by line 8A-8A in FIG. 5B. The arrangement 80 illustrated in FIG. 8A realizes a rectangular layout of columns (cf. FIG. 3A). The shape of the magnetic field shielding tube 120 may be chosen as needed, preferably having a suitable cross-section shape, extending along the Z direction so as to be parallel to the beam. For instance, the cross-section shape of the tube may be quadratic with rounded inner corners so as to facilitate fabrication of the tube. This shape allows that the tube 120 is positioned in close distance to the ensemble 81 of sub-beams (aperture array field). If the aperture array field is rectangular then the cross-section of the magnetic field tube may advantageously be (rounded) rectangular. The distance between the inner surface of the tube 120 and the sub-beams ensemble 81 may be about 0.5 to 1.0 mm, for instance.

FIG. 8B shows a variant arrangement 80' of several columns in a rhombic layout (cf. FIG. 3B) in a cross sectional view analogous to FIG. 8A. The tubes 129 are suitably shaped surrounding the respective ensemble 81' of sub-beams, for instance, having a cross-section of quadratic shape with rounded inner corners From the above it will become clear that the free-drift region F1, F2 and in particular the free-field space created by the distance h1, h2, offers considerable space between the beams 81, 81' of the sub-columns, which allows for sufficient space enabling data path access from the side to the individual columns and the DAPs therein. In contrast, in the PDDs of prior art the plate components AAP, DAP, and FAP were arranged closely packed, in order to avoid possible deviations of the sub-beams, which renders a data-path access in the prior-art PDDs difficult. The condenser optic components of the illuminating system have a circular shape (corresponding to the circles depicted in FIGS. 3A and 3B) and will come very near to each other in the compact arrangement of columns required for an efficient throughput. Thus, the illuminating systems of the columns hinder a sufficient data path access to the PDD system from the upstream side. The same considerations apply mutatis mutandis for the projections system and data path access from the downstream side. The embodiments of the invention solve this problem by creating additional space within the PDD system through the provision of the tFAPs and bFAPs.

The DAP of each column is located in a blanking unit of the respective PDD arrangement. In the simplest case, the blanking unit is represented by the DAP only; the blanking unit may include further plate components of the PDD arrangement, for instance the respective AAP. According to an advantageous variant embodiments of the invention, the AAP and DAP of a PDD arrangement of a single column are positioned in close vicinity to each other and mounted within a structural unit 200, referred to as blanking "package" or simply "package" (FIGS. 10 and 11); the package is arranged at a respective distance to the FAP, with the distance chosen suitably so as to provide sufficient data path access.

Figure 9:
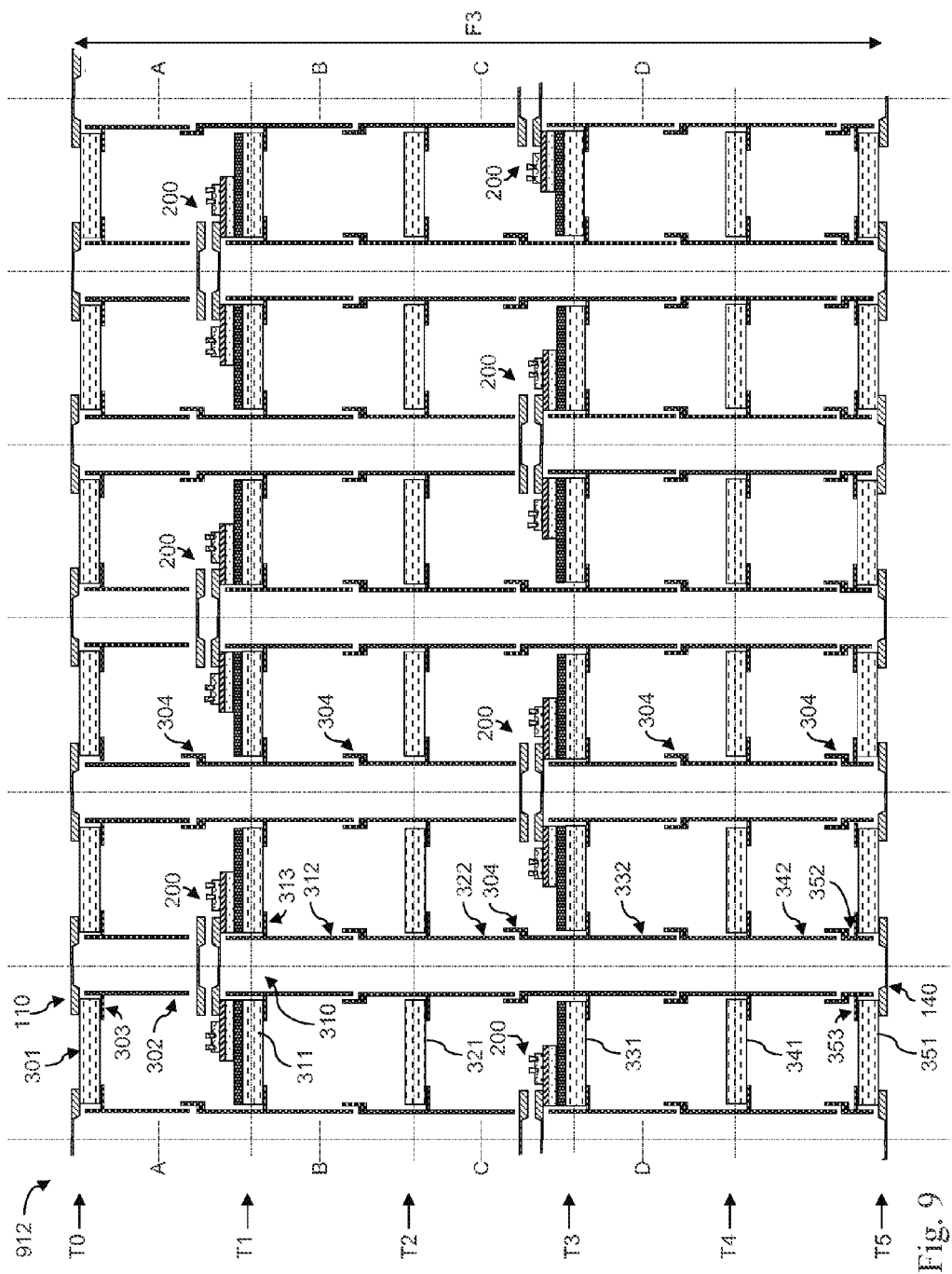
FIG. 9 shows another embodiment where the PDDs have a Z-staggered arrangement of the AAP-DAP packages.

Another aspect of many embodiments of the invention addresses a possible problem with the width of the PDD arrangements transversal to the beams, since the width may be large enough that it is not possible to arrange the PDDs side-by-side as shown in FIG. 5B. In order to relieve this problem, this aspect provides that the blanking units of the PDDs (beam shaping devices) of the columns are positioned not at one uniform distance to the respective FAP, but such that different blanking units may be positioned at different Z levels. (Obviously, this aspect can be combined with the implementation of packages as discussed above.) This will result in a Z-staggered arrangement. This is illustrated in FIG. 9, which shows a PDD arrangement 912 of the PDDs of several columns in a schematic longitudinal section. Again, only a small number of columns are shown, to represent a much larger number of columns that are present in the multi-column apparatus.

The example depicted in FIG. 9 relates to a sub-column configuration where each sub-column exposes one die field according to a rectangular arrangement of columns (cf. FIG.

3A); the field-free region F3 is segmented into several segments in consecutive order along the Z direction, in this example five segments, which define several tiers for the plate components of the PDD arrangements, in the example six tiers T0 . . . T5. In particular, the DAPs of adjacent columns are distributed over different tiers. Thus, the Z-staggered arrangement accomplishes a considerably increased space available around each DAP for the data path access.

In tier T0 the tFAP units 110 for each sub-column are mounted onto a common base plate 301. The base plate 301 is fabricated from a suitable base material preferably, a material is chosen which has high elasticity module and high thermal conductivity; this allows that the base plate 301 can be cooled with state-of-the-art techniques and thus kept precisely at desired temperature. Further, the base plate 301 may be covered with an electrically conductive coating, at least at its relevant parts, in order to allow draining off accumulated electrostatic charges, so as to avoid charging effects. Furthermore, magnetic shielding tubes 302 are mounted to the base plate 301, by means of suitable attachment devices 313, for each sub-column, traversing the segment spanning from tier T0 to T1.

In tier T1, several AAP/DAP packages 200 are provided. The packages 200 are mounted onto a common base plate 311 provided with holes 310, one for each column. This base plate 311, as well, can be cooled and kept precisely at desired temperature, and may be covered with a conductive layer to avoid charging effects. Magnetic field shielding tubes 312 are mounted by means of respective attachment devices 313 at the holes 310, traversing the latter and surrounding the beam of the respective column.

Figure 12A:
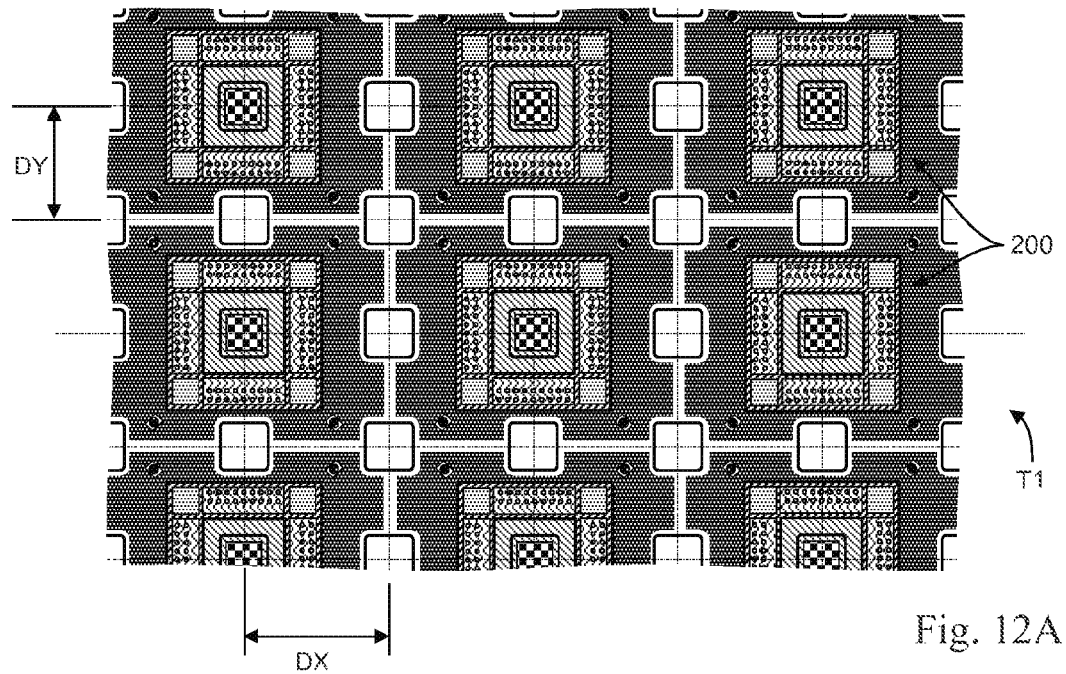
FIGS. 12A-12D depict the mutual arrangement of the AAP-DAP packages in the various tiers of the Z-staggered arrangement.
Figure 12B:
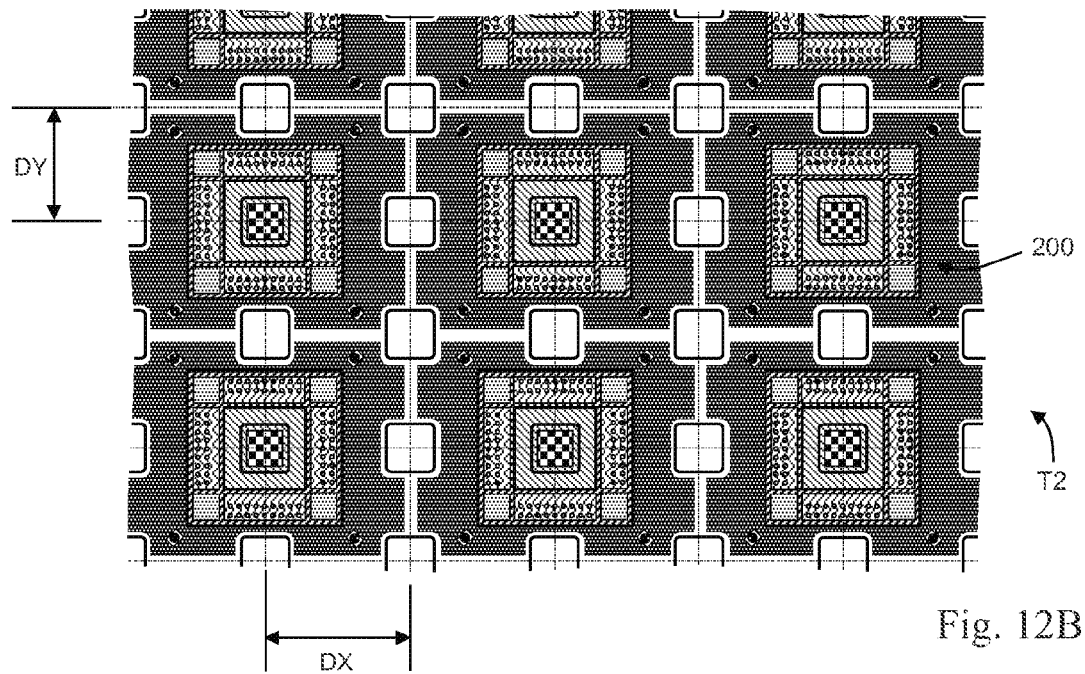
Figure 12C:
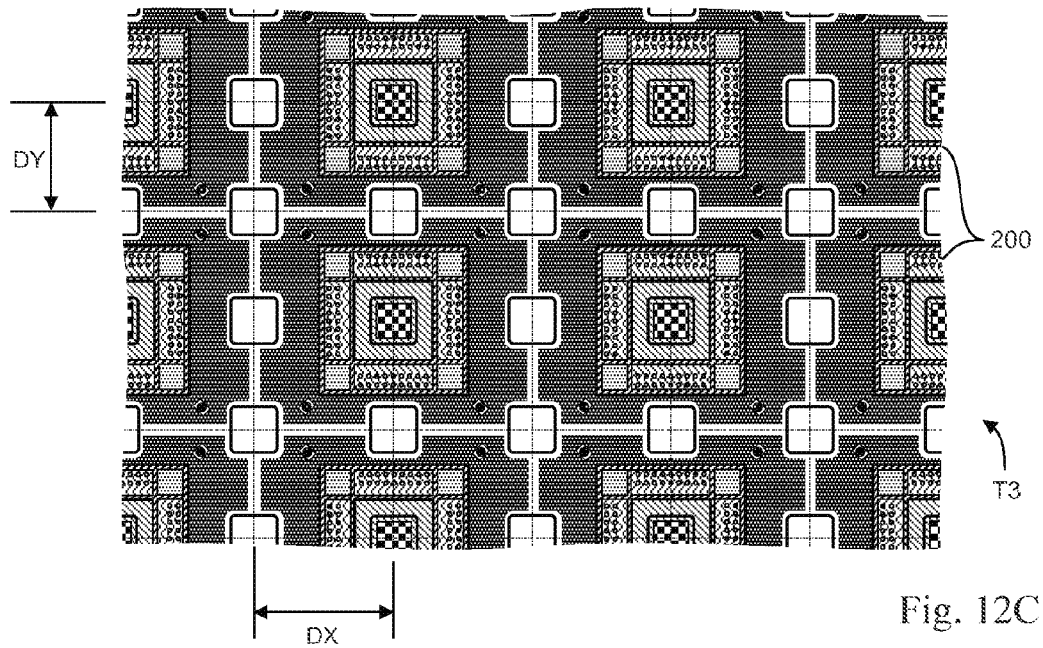
Figure 12D:
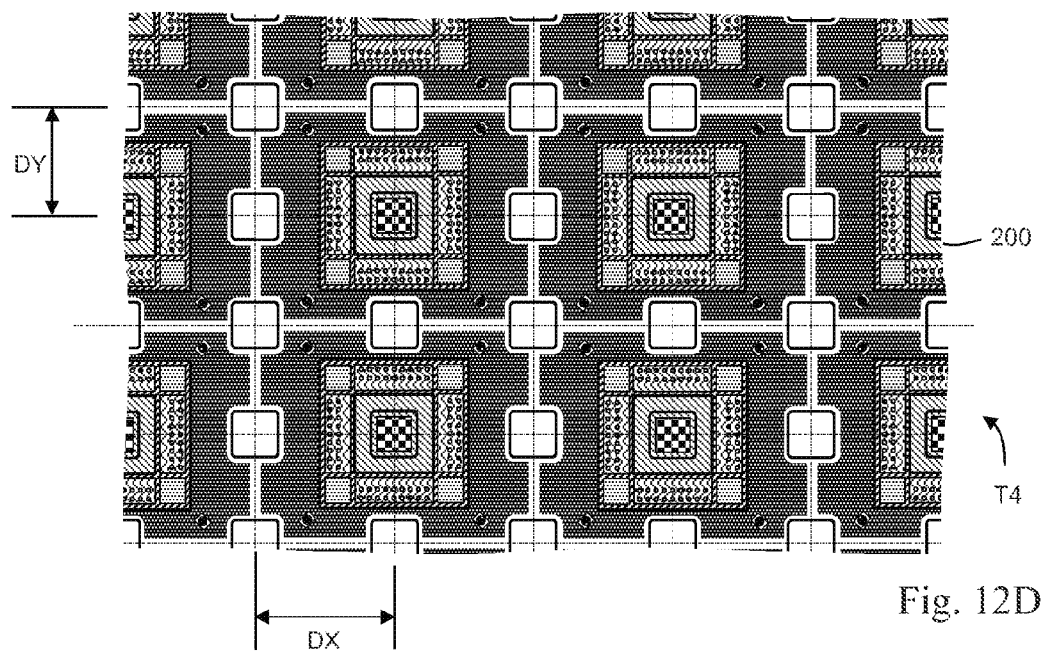

Likewise, in tiers T2, T3, and T4 further packages 200 are mounted onto respective base plates 321, 331, 341, which can be cooled and kept precisely at desired temperature. In FIG. 9 the tiers T2 and T4 appear to contain no package 200, but in fact those tiers contain packages at other vertical planes, due to the staggered arrangement and as will become clear from the explanation given below with FIGS. 12A 12D. At each tier magnetic field shielding tubes 322, 332, 342 are mounted so as to span from one segment to the next through respective holes in the respective base plate.

In order to further increase the effect of the magnetic shielding tubes, the tubes may be provided with sockets 304 where they continue from a preceding tube, so as to ensure a good joining of subsequent tubes wherever no package 200 is present at the respective location. The sockets 304 serve to achieve a virtually seamless magnetic shielding of the beams passing the columns and thus avoid cross talk between the sub-columns.

In the final, lowermost tier T5 the bFAPs 140 are present. They are mounted onto a common base plate 351 (corresponding to base plate 132 of FIG. 5B) by means of suitable attachment devices 353. Magnetic field shielding tubes 352 may be provided to ensure a proper magnetic shielding down to the bFAPs. The base plate 351, as well, can be cooled and kept precisely at desired temperature.

The data path lines (not shown in FIG. 9) extend through the ample space of the segments formed between the tiers T0 . . . T5, and within each segment outside the regions traversed by the sub-beams (i.e., outside the shielding tubes if those are implemented).

Figure 10:
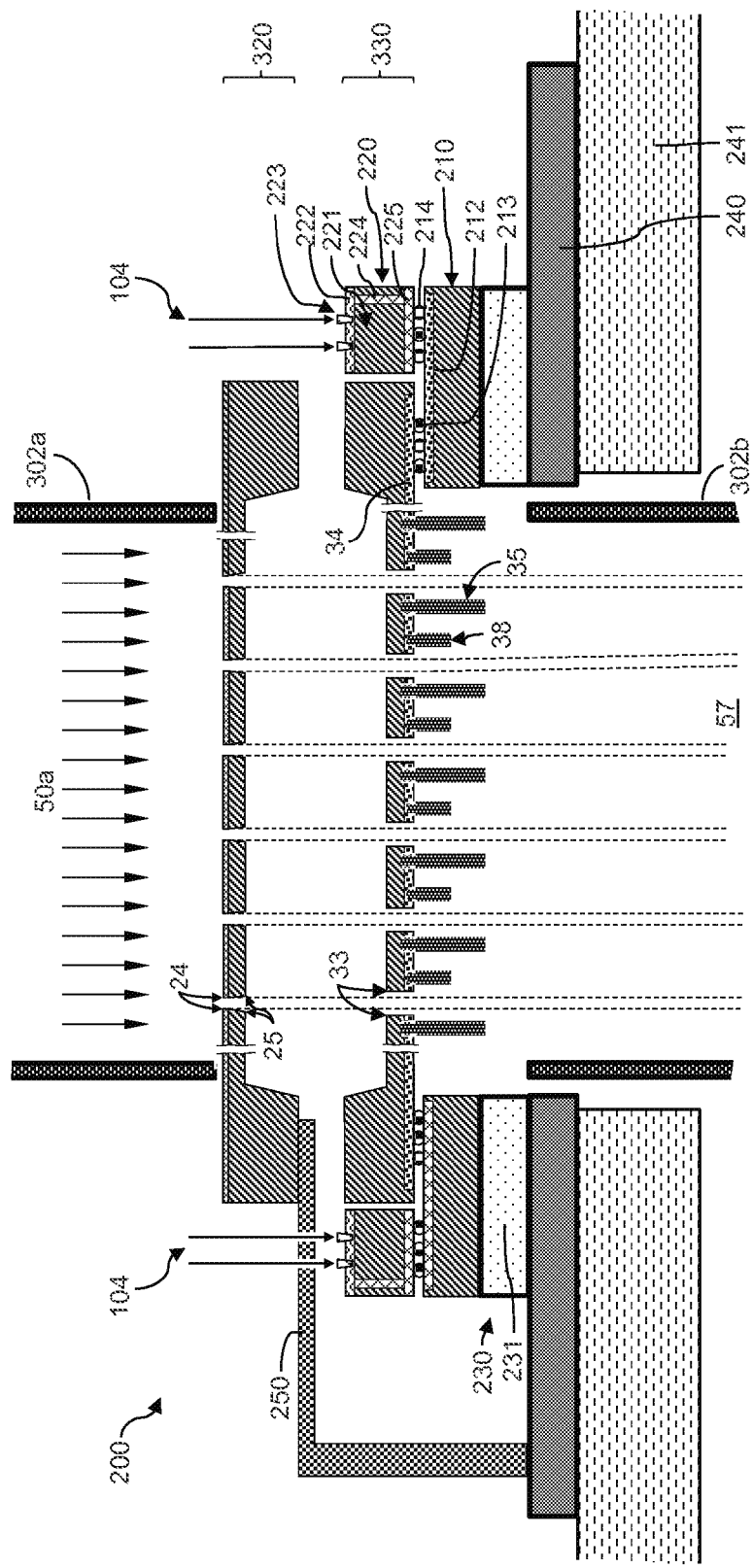
FIG. 10 is a longitudinal sectional view of one of the AAP-DAP packages of FIG. 9.
Figure 11:
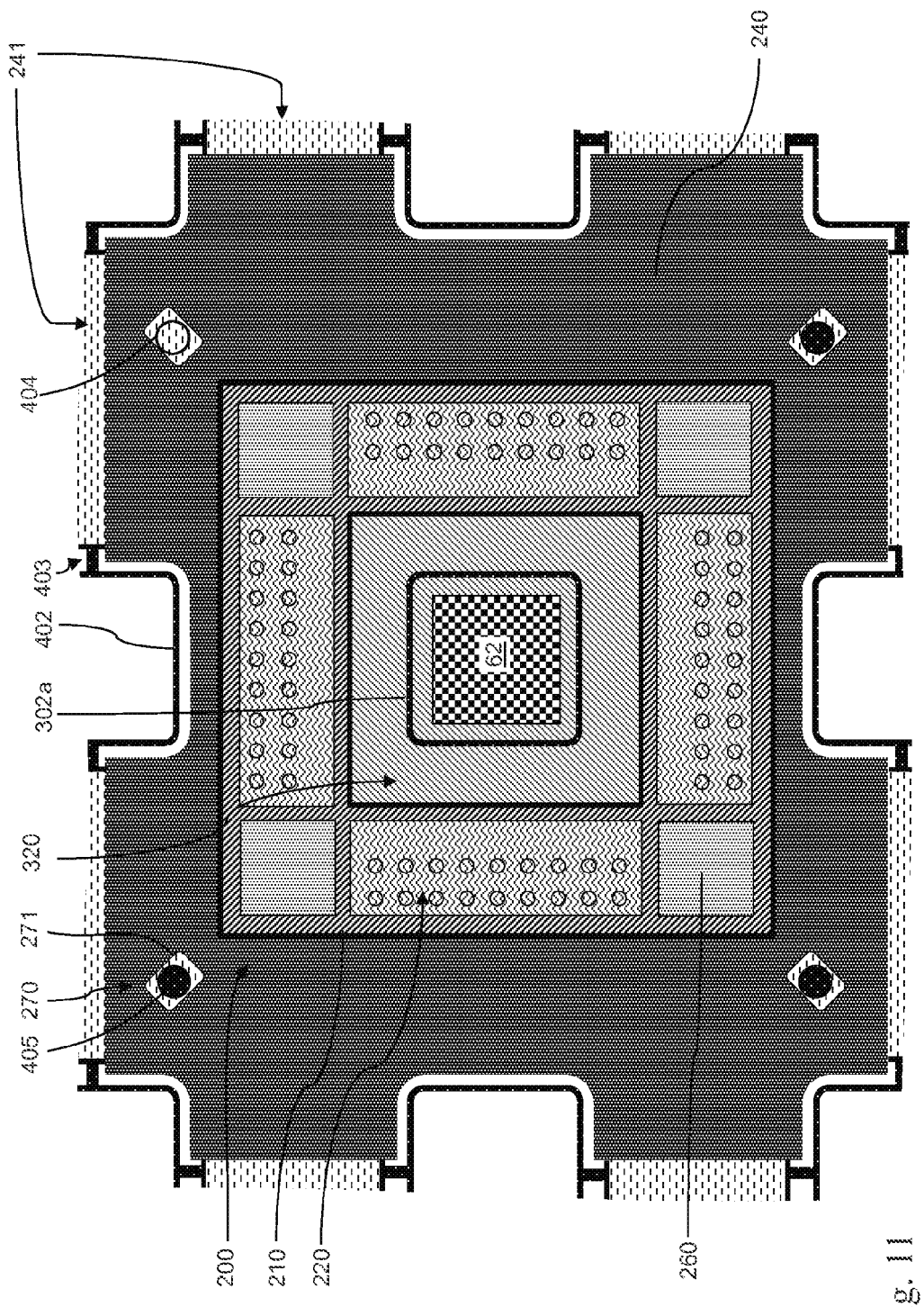
FIG. 11 is a plan view of the AAP-DAP package of FIG. 10.

FIGS. 10 and 11 show a "package" 200 of one PDD of the arrangement of FIG. 9 in a longitudinal section and a plan view, respectively. The package 200 includes an AAP 320 and DAP 330 and is mounted onto a support board 240, which may be realized as a PCB and is in turn positioned on the base plate 241 of the respective tier, or in a (not shown) variant directly to said base plate. Two consecutive shielding tubes 302a, 302b surround the beam 50a, 57.

The DAP 330 is bonded to an interposer 210, which consists of a silicon chip 211 with CMOS electronics 212. Bonding contacts 213 provide electrical contacts from the electronics 212 to the CMOS circuitry 34 of the DAP. Suitable implementations of state-of-the-art interposer and packaging techniques are described in H. Y. Li et al., "Through-Silicon Interposer Technology for Heterogeneous Integration", Future Fab Intl., Issue 45 (Apr. 25, 2013).

The interposer 210 further comprises, on the outer region of the electronics 212, additional contacts 214 onto which receiver devices 220 for data path access are mounted. The receiver device 220 is realized as, e.g., an optical receiver chip 221 having an array of photodiodes 223, in the case that the data path access 104 is achieved via optical beams. In case of electrical access (e.g., via ribbon cable) the receiver device 220 may include a multi-wire connector. The electric connection from the top of the receiver device 220 to the bottom wiring layer 225 is possible through TSV (Through Silicon Via) 224 so as to allow that the device 220 can be bonded and electrically connected at the bonding contacts 214.

As mentioned earlier, the base plate 241 may be cooled and kept at desired temperature. In addition, in a further embodiment of the invention a cooling device 230 may be provided for each PDD with vacuum-tight chambers 231 which are configured for a cooling fluid being directed through them, such as a cooling liquid having, preferably, low viscosity but high heat capacity (e.g., de-ionized water) or a cooling gas (e.g., Helium). Vacuum-tight flexible cooling media access (not shown) are used to pass the cooling liquid or cooling gas through chambers 231. Cooling devices, connections and coolant fluids suitable for this purpose are well known from prior art.

There is no direct mechanical connection between the AAP 320 and the DAP 330. Instead, the AAP 320 is mounted on a mechanical device 250, schematically depicted in FIG. 10. For each AAP/DAP-package 200 the respective AAP 320 will be fine-positioned relative to the respective DAP 330 prior to mounting the packages 200 to the support board 240 and insertion into the multi-beam multi-column system. Alternatively, as already realized by the applicant and topic of U.S. Pat. No. 8,546,767, the AAP 320 may be adjustable in situ with regard to fine-positioning in X, Y position and/or rotation, e.g., by means of piezo-drives provided as components of the device 250, in order to ensure that the sub-beams generated by the apertures of AAP, upon illumination with the wide beam 50a, will all pass through the corresponding aperture openings 33 of the DAP 330.

In variant embodiments, cooling means may be provided to the AAP as well. However, it is expected that for a multi-beam multi-column system a cooling of the AAP is not necessary. Even when using the arrangement according to FIG. 7 where the top surface of the AAP 20 is illuminated by the broad beam 50 the power load is low, (i) due to the low energy (e.g., 5 keV) of the beam 50, and (ii) by the fact that the current density at the AAP is 40,000-times smaller than at the substrate when using a projection optics with 200:1 reduction. The current density of a multi-beam multi-column system at the substrate is lower than 8 A/cm$^2$ (when using electrons, much lower when using ions). Therefore, the current density at the AAP is <0.2 mA/cm$^2$, and the corresponding power load of <1 W/cm$^2$ will lead to an AAP temperature increase of only a few degrees. The corresponding expansion of the aperture array field is small and can be compensated by electronically adjusting the size of the beam array field 62, 72 at the substrate. Since the aperture openings 33 in the DAP are wider than the aperture openings 24 in the AAP there is sufficient tolerance so as to avoid obstruction of the beams passing through the aperture openings 33 of the DAP.

As can be seen from the plan view of FIG. 11, the AAP-DAP package 200 is mounted onto the base plate 241. The magnetic field shielding tube 302a ends just above the aperture array field 62 of the AAP 320. The shielding tubes 402 of the neighboring columns are visible in FIG. 11 as well. The DAP 330 is positioned below the AAP 320 and mounted onto the interposer 210 as described above. Advantageously, four receiver devices 220 may be provided, one at each side of the square (rectangle) shape of the DAP 330. Furthermore, additional member and/or logic chips 260 may be provided placed on the interposer 210. The magnetic field shielding tubes 402 are mounted at the base plate 241 by means of attachment components 403.

As visible in FIG. 11 there may be further space on the support board 240, which can be used for accommodating additional memory and logic chips and additional devices of the optical data path, which do not form part of the embodiments of the present invention.

FIGS. 12A to 12D show a series of partial plan views of the tiers T1 to T4, respectively, corresponding to respective sections along planes indicated in FIG. 9 by lines A-A, B-B, C-C, and D-D, respectively. Each partial plan view shows the area of several columns (6 DX×5 DY) at the same position with respect to X and Y coordinates. The packages 200 are arranged with a periodicity of 2*DX in X-direction and of 2*DY in Y-direction within each tier, but there is an offset along DX and/or DY between consecutive tiers. From the combination of these figures it will be clear that in each tier the packages 200 are positioned such that for each pair of directly adjacent columns, the packages are at different tiers.

In a further embodiment of the invention, the AAP/DAP-package 200 may be positioned on the base plate 241 by means of a kinematic mount 270 constituted by four 45° openings 271 in the support board 240. There are four 45° sockets 404 in the base plate 241 into three of which positioning pins 405 are inserted. A thermal expansion of the support board 240, which may be caused by heat generated in the electronics of the DAP CMOS layer and receiver device, will not change the X, Y and rotation positions of the DAP. As mentioned above, below the silicon interposer 210 there may be a cooling device 230 in order to minimize any change of temperature of the support board 240.

The invention claimed is:

1. A charged-particle multi-beam processing apparatus for exposure of a target with a plurality of beams of electrically charged particles, comprising a plurality of particle-optical columns arranged parallel along a Z direction and configured for directing a respective particle beam towards the target, wherein each particle-optical column comprises:
    an illumination system,
    a beam shaping device and
    a projection optics system,
    the illumination system being configured to produce a respective beam and form it into a substantially telecentric beam illuminating the shaping device, the beam shaping device being configured to form the shape of the illuminating beam into a desired pattern composed of a multitude of sub-beams, and the projection optics system being configured to project an image of the beam shape defined in the shaping device onto the target,
    wherein each beam shaping device comprises:
    an aperture array device provided with an array of apertures, said array of apertures comprising a multitude of apertures, each of which defines the shape of a respective sub-beam having a nominal path towards the target, and
    a deflection array device, configured to deflect selected sub-beams off their respective nominal path so that sub-beams thus selected do not reach the target,
    wherein each beam shaping device is provided with:
    a first field-boundary device as the first element of the respective beam shaping device traversed by the beam, the first field-boundary device having a first surface oriented towards the illumination system, and thereby configured to exclude electromagnetic fields of the illumination system from the respective beam shaping device,
    a second field-boundary device as the last element of the respective beam shaping device traversed by the beam, the second field-boundary device having a second surface oriented towards the projection optics system, and thereby configured to exclude electromagnetic fields of the projection optics system from the respective beam shaping device, and
    at least one of the first and second field-boundary devices delimiting a non-obstructed field-free space interval within the respective beam shaping device, said field-free space interval being configured to accommodate feeding lines for controlling the deflection array device of the respective beam shaping device.

2. The apparatus of claim 1, wherein the feeding lines for the deflection array devices of the columns are distributed at multiple levels of height with regard to the Z direction within the field-free space interval.

3. The apparatus of claim 2, further comprising shielding tubes, each shielding tube located within a respective beam shaping device in the respective field-free space and having a generally cylindrical or prismatic shape coaxial with the Z direction, entirely surrounding the beam traversing the respective beam shaping device, said shielding tube being made of a material suitable to provide a magnetic and/or electric shielding of the beam.

4. The apparatus of claim 2, wherein at least one of the first and second field-boundary devices is arranged at a distance along the Z direction to the other components of the respective beam shaping device to provide a field-free space with regard to electric fields within the respective pattern definition device.

5. The apparatus of claim 1, further comprising shielding tubes, each shielding tube located within a respective beam shaping device in the respective field-free space and having a generally cylindrical or prismatic shape coaxial with the Z direction, entirely surrounding the beam traversing the respective beam shaping device, said shielding tube being made of a material suitable to provide a magnetic and/or electric shielding of the beam.

6. The apparatus of claim 1, wherein at least one of the first and second field-boundary devices is arranged at a distance along the Z direction to the other components of the respective beam shaping device to provide a field-free space with regard to electric fields within the respective pattern definition device.

7. The apparatus of claim 6, wherein the first field-boundary device of at least one of the columns is a device separate from the aperture array device of the respective column.

8. The apparatus of claim 6, wherein the first field-boundary device of at least one of the columns is the aperture array device of the respective column.

9. The apparatus of claim 6, wherein the first and second field-boundary devices are realized as generally plate-shaped components, arranged parallel to each other and at a mutual distance along the Z direction.

10. The apparatus of claim 6, wherein the first field-boundary devices of the columns are arranged at a uniform first height (T0) with regard to the Z direction and the second field-boundary devices of the columns are arranged at a uniform second height (T5) with regard to the Z direction, whereas the deflection array devices of the respective beam shaping device are arranged at a number of height levels (T1 . . . T4) between the first and second heights, wherein for each column a blanking unit including the respective deflection array device is arranged at a height level different from the height levels of the blanking unit of the columns adjacent to the respective column.

11. The apparatus of claim 6, wherein said first and second field-boundary devices include respective arrays of openings corresponding to the apertures of the aperture array device of the respective column, wherein said first and second surfaces are flat with the exception of the respective array of openings.

12. The apparatus of claim 1, wherein the first field-boundary device of at least one of the columns is a device separate from the aperture array device of the respective column.

13. The apparatus of claim 1, wherein the first field-boundary device of at least one of the columns is the aperture array device of the respective column.

14. The apparatus of claim 1, wherein the first and second field-boundary devices are realized as generally plate-shaped components, arranged parallel to each other and at a mutual distance along the Z direction.

15. The apparatus of claim 1, wherein the first field-boundary devices of the columns are arranged at a uniform first height (T0) with regard to the Z direction and the second field-boundary devices of the columns are arranged at a uniform second height (T5) with regard to the Z direction, whereas the deflection array devices of the respective beam shaping device are arranged at a number of height levels (T1 . . . T4) between the first and second heights, wherein for each column a blanking unit including the respective deflection array device is arranged at a height level different from the height levels of the blanking unit of the columns adjacent to the respective column.

16. The apparatus of claim 1, wherein said first and second field-boundary devices include respective arrays of openings corresponding to the apertures of the aperture array device of the respective column, wherein said first and second surfaces are flat with the exception of the respective array of openings.

17. The apparatus of claim 1, wherein the feeding lines are realized as data lines which enter into the beam shaping device separate from the deflection array device.

18. A beam shaping device for use in a charged-particle multi-beam processing apparatus for exposure of a target, said beam shaping device being configured to be irradiated by an illuminating beam of electrically charged particles and to form the shape of the illuminating beam into a desired pattern composed of a multitude of sub-beams, wherein the beam shaping device comprises:
an aperture array device provided with an array of apertures, said array of apertures comprising a multitude of apertures, each of which defines the shape of a respective sub-beam having a nominal path towards the target, and
a deflection array device, configured to deflect selected sub-beams off their respective nominal path so that sub-beams thus selected do not reach the target,
wherein the beam shaping device is provided with:
a first field-boundary device as the first element of the beam shaping device traversed by the beam, the first field-boundary device having a first surface oriented towards the illumination system, and thereby configured to exclude electromagnetic fields of the illumination system from the beam shaping device
a second field-boundary device as the last element of the beam shaping device traversed by the beam, the second field-boundary device having a second surface oriented towards the projection optics system, and thereby configured to exclude electromagnetic fields of the prosection optics system from the beam shaping device, and
at least one of the first and second field-boundary devices delimiting a non-obstructed field-free space interval within the beam shaping device, said field-free space interval being configured to accommodate feeding lines for controlling the deflection array device of the beam shaping device.

19. The beam shaping device of claim 18, wherein the feeding lines are realized as data lines entering the beam shaping device separate from the deflection array device.

* * * * *